United States Patent
Alzaydi

(10) Patent No.: US 12,441,203 B1
(45) Date of Patent: Oct. 14, 2025

(54) GEOTHERMALLY COOLED ELECTRIC VEHICLE CHARGING INFRASTRUCTURE

(71) Applicant: KING FAHD UNIVERSITY OF PETROLEUM AND MINERALS, Dhahran (SA)

(72) Inventor: Ammar Ayad Alzaydi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 19/228,433

(22) Filed: Jun. 4, 2025

(51) Int. Cl.
| | |
|---|---|
| H02J 7/00 | (2006.01) |
| B60L 53/10 | (2019.01) |
| B60L 53/16 | (2019.01) |
| B60L 53/18 | (2019.01) |
| B60L 53/302 | (2019.01) |
| H05K 7/20 | (2006.01) |

(52) U.S. Cl.
CPC ............. *B60L 53/302* (2019.02); *B60L 53/11* (2019.02); *B60L 53/16* (2019.02); *B60L 53/18* (2019.02); *H05K 7/20254* (2013.01); *H05K 7/20263* (2013.01); *H05K 7/20272* (2013.01); *H05K 7/20281* (2013.01); *H05K 7/20927* (2013.01)

(58) Field of Classification Search
None
See application file for complete search history.

(56) References Cited

U.S. PATENT DOCUMENTS

| | | |
|---|---|---|
| 11,214,159 B2 | 1/2022 | Heyne et al. |
| 11,240,935 B2 | 2/2022 | Chainer et al. |
| 2016/0135318 A1* | 5/2016 | Dean ............ G11B 33/08 361/679.33 |
| 2020/0027594 A1 | 1/2020 | Hunt et al. |
| 2021/0013559 A1* | 1/2021 | Lee ................ H01M 10/6568 |
| 2021/0325090 A1* | 10/2021 | Pfütze-Rämsch ....... F24T 10/17 |
| 2021/0381725 A1 | 12/2021 | Lakic |
| 2022/0136739 A1* | 5/2022 | Liu ................ F24D 3/18 165/45 |
| 2022/0314826 A1 | 10/2022 | Niwa |
| 2023/0322106 A1 | 10/2023 | Lopez et al. |

FOREIGN PATENT DOCUMENTS

| | | |
|---|---|---|
| CN | 114382541 A | 4/2022 |
| CN | 117565712 A | 2/2024 |
| JP | 2015-534164 | 11/2015 |

* cited by examiner

*Primary Examiner* — Arun C Williams
(74) *Attorney, Agent, or Firm* — Oblon, McClelland, Maier &Neustadt, L.L.P.

(57) ABSTRACT

A charging station for electric vehicles comprising a plurality of charge terminals located above ground and a plurality of charging pods located below ground, each connected to a charge terminal. Each charging pod includes an electric vehicle charger having a plurality of electronic charging components. A plurality of heat exchange plates are located over the electronic charging components. Each heat exchange plate includes a coolant inlet and a coolant outlet connected to ends of the heat exchange plate. A coolant input line connects to the coolant inlet; a coolant output line connects to the coolant outlet. A cooling system includes a coolant supply tank holding a coolant, and a coolant pump. A plurality of geothermal coils are fluidly connected between the coolant output line and the coolant pump. The plurality of geothermal coils are buried at a below ground depth of about 15 m to 20 m.

18 Claims, 20 Drawing Sheets

GEOTHERMALLY COOLED ELECTRIC VEHICLE CHARGING INFRASTRUCTURE

CROSS REFERENCE TO RELATED APPLICATIONS

The present disclosure claims the benefit of Saudi Patent No. 1020253679, filed May 25, 2025, with the Saudi Authority for Intellectual Property Office, which is incorporated herein by reference in its entirety.

BACKGROUND

Technical Field

The present disclosure is generally directed to electric vehicle supply equipment (EVSE), and more specifically to systems and methods for providing electric vehicle charging infrastructure utilizing geothermal cooling.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The global adoption of electric vehicles is undergoing rapid expansion, forming a significant part of strategies aimed at reducing carbon emissions and mitigating impacts associated with climate change. This transition toward electric mobility necessitates a parallel and progressive development of electric vehicle charging infrastructure. While advancements in charging technology have largely concentrated on enhancing charging speed and user accessibility, the suitability of existing technologies for operation under extreme climatic conditions, such as those encountered in regions having very hot seasons and excessive dust or very cold seasons with snow, sleet or ice crystal formation, remains an area requiring further attention. Environmental factors including high ambient temperatures and the prevalence of dust and sand present unique operational challenges for standard electric vehicle charging station designs in such regions. Equivalently, very cold environments present another set of challenges due to damage from the elements, degradation of battery storage capability and the like.

Traditional electric vehicle charging stations are predominantly installed above ground. This conventional placement results in continuous exposure of the charging equipment to direct sunlight and other environmental elements, leading to considerable thermal management difficulties. High ambient temperatures can significantly affect the operational efficiency and safety margins of the charging process itself. Consequently, there is an escalated requirement for effective cooling solutions in hot environments or heating solutions in cold environments to maintain equipment within acceptable temperature limits. However, commonly employed cooling/heating mechanisms often involve complex system configurations and entail substantial costs, impacting both the initial capital investment and the ongoing operational expenditures due to energy consumption and recurring maintenance needs.

Electric vehicle charging infrastructure is fundamental to the widespread adoption and practical functionality of electric vehicles. However, shifts in global climate patterns and rising temperatures, particularly observed in arid and semi-arid regions, increasingly compromise the operation and efficiency of electric vehicle charging stations due to these extreme environmental conditions. Several prevalent issues confront current electric vehicle charging infrastructure deployed in hot climates.

High ambient temperatures represent a primary concern. In geographic areas where temperatures frequently exceed 40 degrees Celsius, conventional above-ground charging stations are susceptible to overheating. Such excessive heat exposure can lead to a reduction in the efficiency of electrical components and elevates the risk of hardware failure. Operation at high temperatures also necessitates the implementation of extensive cooling systems, which consequently consume significant amounts of energy and demand regular maintenance interventions.

Furthermore, environmental exposure poses challenges. Charging stations installed above ground are constantly subjected to ultraviolet (UV) radiation, airborne sand and dust particles, and wind forces. This exposure accelerates the physical wear and tear on components. It also increases the probability of particulate matter ingress into the system enclosures, potentially obstructing cooling fans or pathways and degrading electrical insulation properties. The cumulative effect results in increased maintenance costs and reduced service intervals, thereby diminishing the overall reliability of the charging infrastructure.

Energy consumption associated with cooling needs is another significant factor. Conventional cooling solutions utilized in electric vehicle charging stations, such as air conditioning units or forced-air circulation systems, are often energy-intensive and contribute substantially to operational costs. These cooling systems may need to operate continuously or frequently to counteract the thermal load imposed by both the charging process and the external environment. This leads to high operational expenditures and increased carbon emissions associated with the energy consumed, which can partially offset the environmental advantages pursued through the adoption of electric vehicles.

Additionally, the requirement for effective cooling and protection from environmental factors can impose limitations on the placement options for charging stations. Suitable locations often need considerations for adequate shading, air quality, and minimized exposure to direct solar radiation. These constraints can limit the deployment possibilities for establishing widespread and easily accessible charging networks, particularly in environments where such protective features are scarce.

Hot and arid climates introduce specific difficulties that affect the efficiency, durability, and overall performance of electric vehicle charging stations. Thermal management becomes a primary issue in regions with ambient temperatures regularly exceeding 40 degrees Celsius. Standard electronic components employed in charging stations, including inverters and power conversion modules, exhibit sensitivity to heat, which can diminish the efficiency and operational lifespan of these components. Prolonged exposure to high temperatures may result in thermal degradation of semiconductor materials and accelerated aging of passive components like capacitors, increasing the probability of equipment failures.

The need to combat overheating necessitates the use of complex cooling systems. These systems consume substantial energy and must exhibit high reliability to operate continuously under harsh conditions. The increased demand for cooling translates directly into higher operational costs and greater energy usage. Furthermore, hot and arid climates are often associated with environments where dust and sand accumulation occurs on and within charging equipment. This accumulation can obstruct cooling pathways, such as fans and air intakes, further complicating thermal management. Abrasive particles can also contribute to the wear of mechanical parts and compromise the integrity of electrical connections, leading to reduced efficiency and increased maintenance requirements.

Direct exposure to intense solar radiation can elevate the surface temperature of charging station enclosures and associated equipment significantly above the ambient air temperature. This solar heat gain adds to the total thermal load that the cooling system must manage to maintain operational integrity and efficiency. Moreover, exposure to UV radiation can degrade materials used in the construction of charging station housings, such as certain plastics or elastomers, potentially compromising structural integrity or aesthetic appearance over time. Building and maintaining infrastructure in such climates demands materials and designs capable of withstanding not only high temperatures but also potentially large diurnal temperature fluctuations. Traditional construction materials and techniques may not provide optimal performance under these extreme conditions, necessitating the development of solutions ensuring long-term durability and reliability.

Additionally, a storage battery must expend extra energy to maintain an optimal operating temperature when temperatures are below 20 degrees Fahrenheit (about –7 degrees Celsius). Cold weather can affect battery charging times and range, slowing down the charging process as the battery's chemical reactions happen more slowly. The battery's temperature may need to be preconditioned before charging can start.

The transition towards electric vehicles is a significant component of global strategies to reduce carbon emissions and address climate change. The development of a capable and efficient electric vehicle charging infrastructure is fundamental to this transition, serving as the essential support structure for the widespread adoption of electric mobility. The importance of developing electric vehicle infrastructure encompasses several areas. Environmentally, electric vehicles offer advantages over traditional internal combustion engine vehicles, including reductions in greenhouse gas emissions and air pollutants. However, the realization of these benefits depends heavily on the availability and accessibility of charging facilities. Economically, the expansion of charging infrastructure stimulates technological innovation, creates employment opportunities, and can reduce reliance on fossil fuels, enhancing energy security. Operational savings from using electric vehicles also provide long-term economic benefits.

Regarding energy security, electric vehicles facilitate diversification of energy sources for transportation, lessening dependence on fossil fuels. A well-developed charging network enables the energy demand from transportation to be met increasingly by renewable sources. Consumer confidence and adoption rates are directly influenced by the convenience and reliability of charging infrastructure; range anxiety remains a barrier that can be mitigated by expanding the charging network. Furthermore, efficient and widely available infrastructure supports both urban and rural development, potentially bridging mobility gaps and contributing to sustainable urban planning when integrated with public transport systems. Given these factors, developing innovative charging solutions is necessary to address challenges, particularly those unique to specific climates like hot and arid regions, thereby contributing to sustainable development and climate change mitigation goals.

The landscape of electric vehicle charging technologies has evolved considerably, driven by advancements in battery technology and increasing vehicle adoption. Current technologies are often categorized by charging speed and power delivery method. Level 1 charging utilizes standard residential 120-volt AC outlets, offering slow charging suitable primarily for overnight use. Level 2 charging operates on 240-volt AC power, common in residential and public installations, providing significantly faster charging speeds suitable for daily replenishment. DC Fast Charging (DCFC) represents the highest power tier, supplying high-voltage direct current directly to the vehicle battery for rapid charging, often adding substantial range in under 30 minutes, making DCFC suitable for en-route charging. However, DCFC stations involve higher installation and operational costs and place greater demands on the electrical grid and thermal management systems.

Emerging technologies include wireless (inductive) charging, which offers convenience by eliminating physical connectors but currently faces challenges in efficiency and cost. Smart charging technologies are also gaining traction, enabling communication between the vehicle, charger, operator, and power grid to optimize charging schedules based on grid conditions, energy pricing, and renewable energy availability. This aids in managing grid load and integrating variable renewable sources. Despite these advancements, existing technologies often exhibit limitations, particularly when deployed in extreme environmental conditions.

A significant limitation of existing electric vehicle charging technologies is vulnerability to high or very low ambient temperatures, making thermal management challenging and impacting efficiency and safety. Current cooling methods, often relying on air cooling, can be insufficient in extreme heat, leading to component overheating. The energy consumption of traditional cooling systems, for example, HVAC units, increases operational costs and reduces the net environmental benefit. Charging stations in harsh environments also suffer from accelerated wear due to exposure to dust, sand, UV radiation, and temperature fluctuations, increasing maintenance frequency and cost, and reducing lifespan.

Furthermore, the standard designs of many current charging stations lack adaptability to diverse geographical and climatic conditions, being primarily optimized for moderate climates. This restricts deployment options in extreme environments. The high costs associated with DC fast chargers, particularly their power infrastructure and cooling requirements, pose barriers to widespread deployment, especially in rural or economically constrained areas. While integration with renewable energy sources is increasing, managing the variability of these sources while maintaining reliable operation under extreme climatic constraints presents additional challenges not fully addressed by all current systems.

Various cooling technologies are employed in industrial applications to maintain operational stability, some of which have relevance to electric vehicle charging. Air cooling systems, using fans to circulate ambient air, are common due to simplicity but lose efficiency in high ambient temperatures and are susceptible to blockage by dust. Liquid cooling systems, circulating a coolant through heat exchangers, offer more effective heat transfer, particularly for high heat loads, but are more complex, requiring pumps, reservoirs, and careful maintenance to prevent leaks and corrosion. Heat exchangers themselves, transferring heat between fluids, and heat pipes, utilizing phase change for efficient heat transfer, are established technologies that could be adapted. Phase Change Materials (PCMs), which absorb and release heat at specific temperatures, offer passive thermal buffering capabilities.

Geothermal cooling/heating, which utilizes the stable temperatures found below the Earth's surface as a heat sink, presents a promising approach, particularly for applications like electric vehicle charging stations in hot climates. This method can provide efficient and sustainable cooling/heating by leveraging the ground's thermal mass, potentially maintaining optimal temperatures for electronic components without the high energy costs associated with conventional active cooling methods. While air and liquid cooling/heating represent conventional solutions, their limitations in extreme environments highlight the potential for innovations like geothermal cooling/heating to enhance the sustainability and efficiency of electric vehicle charging infrastructure. Some attempts have been made to address cooling issues in EV chargers using ground-based cooling concepts, as discussed in proceeding paragraphs.

CN117565712A describes an intelligent charging and discharging pile where heat from within the device main body is absorbed by fins and transferred to cooling water within a cooling pipe. The cooling water is circulated to an underground cooling pipe where heat exchange occurs with the surrounding ground temperature via fins associated with the underground pipe. However, this reference does not describe the specific integration of heat exchange plates for direct thermal management of charging electronics coupled with a geothermal loop buried at depths sufficient for stable earth temperature utilization, nor an adaptive control system using multiple sensor inputs including flow and pressure feedback to regulate coolant circulation for optimal thermal performance.

U.S. Ser. No. 11/214,159B2 describes a charging station having power electronics connected to a coolant reservoir located underground at a depth of approximately 1 to 4 meters. The system includes a cooling arrangement utilizing the underground coolant reservoir. However, this reference does not describe the specific integration of heat exchange plates for direct thermal management of charging electronics coupled with a geothermal loop buried at depths sufficient for stable earth temperature utilization, nor an adaptive control system using multiple sensor inputs including flow and pressure feedback to regulate coolant circulation for optimal thermal performance.

US20230322106A1 describes an underground reservoir positioned beneath a charging station for storing coolant. A hose connected to this coolant reservoir interfaces with an electric vehicle to provide cooling directly to the vehicle's battery system, rather than cooling the charger electronics. However, this reference does not describe the specific integration of heat exchange plates for direct thermal management of charging electronics coupled with a geothermal loop buried at depths sufficient for stable earth temperature utilization, nor an adaptive control system using multiple sensor inputs including flow and pressure feedback to regulate coolant circulation for optimal thermal performance.

US20220314826A1 describes an electric vehicle charging station architecture including a charging pad where the associated electronics are positioned underground. However, this reference does not describe the specific integration of heat exchange plates for direct thermal management of charging electronics coupled with a geothermal loop buried at depths sufficient for stable earth temperature utilization, nor an adaptive control system using multiple sensor inputs including flow and pressure feedback to regulate coolant circulation for optimal thermal performance.

Each of the aforementioned references suffers from one or more drawbacks hindering their adoption, such as lack of necessary thermal management capacity for high-power charging in hot climates, less sophisticated control, or high maintenance costs due to component complexity or environmental exposure. Existing approaches suffer from limitations in providing a solution that effectively integrates direct cooling or heating of charging electronics using heat exchange plates with a deep geothermal cooling loop and a control system optimized for efficiency and reliability in extreme temperature environments. Accordingly, it is one object of the present disclosure to provide methods and systems for an electric vehicle charging infrastructure that overcomes the limitations of the related art. The present disclosure aims to overcome these limitations by utilizing stable subterranean temperatures, enhancing thermal management, reducing energy consumption for cooling/heating, minimizing environmental impact, and improving overall system durability and efficiency through an underground installation and adaptive geothermal temperature management.

SUMMARY

In an exemplary embodiment, a charging station for electric vehicles is described, comprising: a plurality of charge terminals located above ground; a plurality of charging pods located below ground, wherein each charging pod is connected to one of the plurality of charge terminals, wherein each charging pod includes: an electric vehicle charger including a plurality of electronic charging components; a plurality of heat exchange plates located in the electric vehicle charger over the electronic charging components, wherein each heat exchange plate includes a coolant inlet and a coolant outlet, wherein the coolant inlet and the coolant outlet are connected to an inlet end and an outlet end respectively of a serpentine coolant coil located on the heat exchange plate; a coolant input line connected to the coolant inlet of each heat exchange plate; a coolant output line connected to the coolant outlet of each heat exchange plate; a cooling system including: a coolant supply tank, wherein the coolant supply tank is configured to hold a coolant, and a coolant pump; and a plurality of geothermal coils fluidly connected between the coolant output line and the coolant pump, wherein the plurality of geothermal coils are buried at a below ground depth in a range of about 15 m to about 20 m.

In another exemplary embodiment, a method for regulating a temperature of each of a charging pod of a charging station for electric vehicles is described, comprising: installing a plurality of charge terminals above ground; installing a plurality of charging pods below ground, wherein each charging pod is connected to a respective one of the plurality of charge terminals, each charging pod including an electric vehicle charger having a plurality of electronic charging components; installing a plurality of heat exchange plates over the electronic charging components, wherein each heat exchange plate includes a coolant inlet and a coolant outlet; connecting the coolant inlet and the coolant outlet to an inlet end and an outlet end respectively of a serpentine coolant coil located on the heat exchange plate; connecting a coolant input line to the coolant inlet of each heat exchange plate; connecting a coolant output line to the coolant outlet of each heat exchange plate; installing a cooling system including: a coolant supply tank, wherein the coolant supply tank is configured to hold a coolant, and a coolant pump; installing a plurality of geothermal coils at a below ground depth in a range of about 15 m to about 20 m; and fluidly connecting the coolant output line to a first coil of the geothermal coils and the coolant pump to a second end of the geothermal coils.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
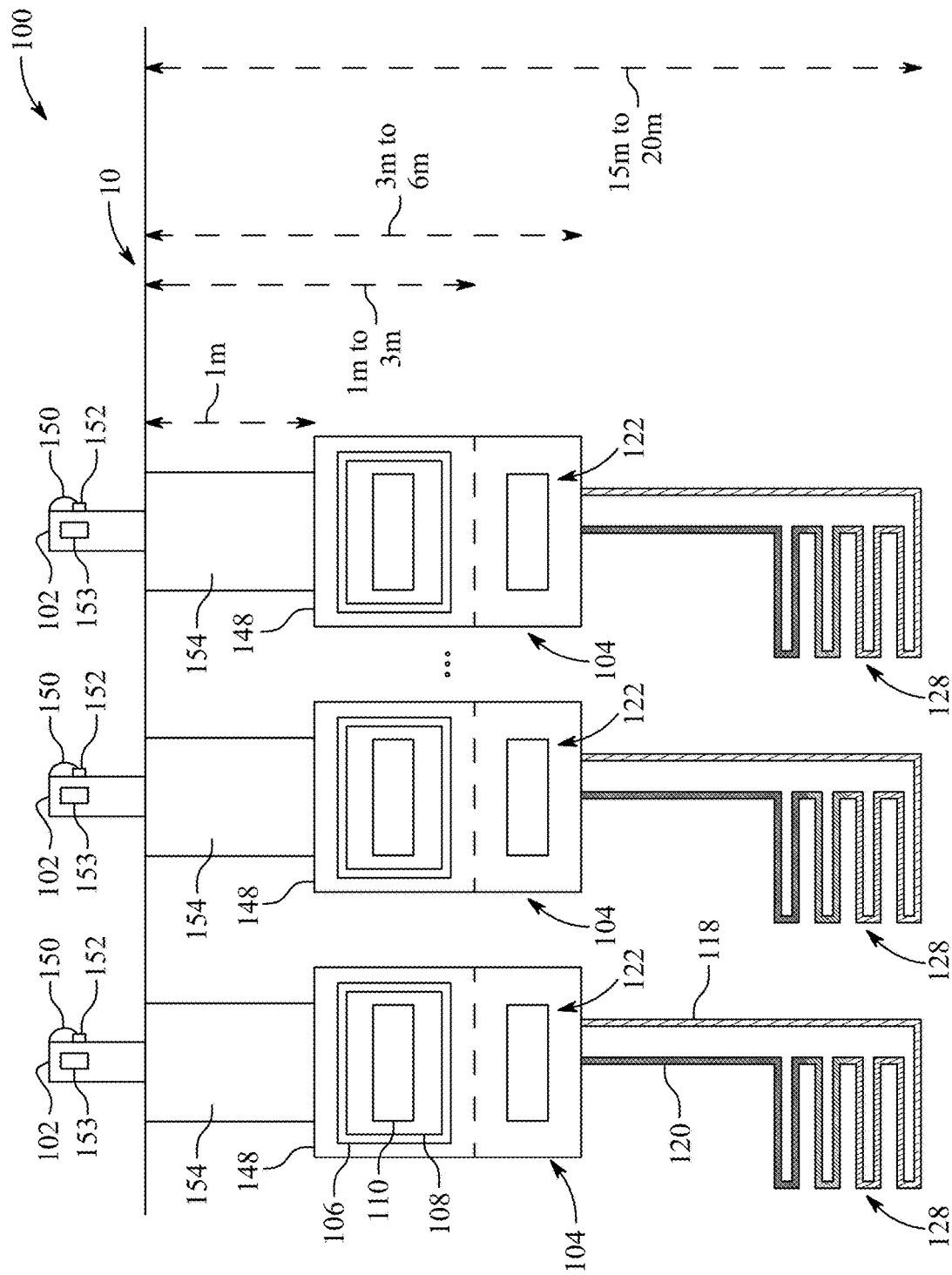
FIG. 1A is a schematic illustration of a charging station, with electronic charging components and cooling system components integrated within underground charging pods, and connected to a geothermal coil, according to a first embodiment.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of the present disclosure are directed to a charging station for electric vehicles and a method for regulating the temperature of components within the charging station. The present disclosure describes configurations and techniques that leverage subterranean placement of temperature-sensitive equipment and utilize geothermal energy exchange principles for thermal management. The present disclosure aims to provide reliable and efficient electric vehicle charging functionality, particularly when deployed in geographical locations subject to challenging environmental conditions, such as extreme ambient temperatures. The charging station and the method of the present disclosure actively manages the thermal state of charging components through controlled circulation of a heat transfer fluid coupled to a ground heat exchange loop based on real-time sensor data.

Referring to FIG. 1A, illustrated is a schematic diagram of a charging station (as represented by reference numeral 100), according to a first embodiment. The charging station 100 of the present disclosure represents an integrated system designed for providing electric vehicle charging services. The charging station 100 includes multiple functional subsystems, including electrical power conversion, thermal regulation, and structural containment, combined within a design that utilizes below-ground installation. The charging station 100 integrates power electronics technology with a dedicated thermal management system based on fluid circulation and geothermal heat exchange principles. The charging station 100 is intended for applications requiring durable and efficient charging operations, such as public charging facilities, commercial fleet depots, or installations in regions characterized by high ambient temperatures or other demanding environmental factors, where conventional surface-level installations may face operational limitations.

As illustrated, the charging station 100 includes a plurality of charge terminals 102 located above ground 10 in the first embodiment. The plurality of charge terminals 102 represent the visible portion of the charging infrastructure, providing accessibility for electric vehicle users in locations such as parking lots, highway rest stops, or urban centers. The charge terminals 102 serve as the primary interface for users connecting electric vehicles to the charging station 100, enabling the delivery of electrical power necessary for recharging battery of the electric vehicle. The charge terminals 102 may be configured to support various charging standards and power levels, including Level 2 AC charging or, more particularly, DC fast charging (DCFC), which allows for significantly reduced charging times but generates substantial heat within the power electronics. The physical housing of the charge terminals 102 is designed to withstand typical above-ground environmental conditions while providing a user-friendly interface, potentially including displays or indicators related to the charging process. The number of charge terminals 102 installed at a given site can vary depending on the expected demand and capacity requirements of the charging station 100. Each charge terminal 102 is electrically and communicatively linked to the underground components responsible for power conversion and control.

The charging station 100 further includes a plurality of charging pods 104 located below the ground 10. The charging pods 104 serve as protective housings for the core power electronics and associated cooling equipment. Each charging pod 104 is functionally associated with and electrically connected to one of the plurality of charge terminals 102 via an electric cable 155 extending underground from the charging pod 104 to the base of the charge terminal 102. This underground configuration positions the sensitive and heat-generating components away from the harsh conditions often encountered at the ground 10, especially in hot and arid climates. This subterranean installation inherently enhances the durability of the system by protecting components from physical damage, vandalism, and environmental elements like dust, sand, snow, sleet and moisture, thereby reducing wear and maintenance requirements.

Each charging pod 104 includes an electric vehicle charger 106. The electric vehicle charger 106 provides the power electronic systems necessary to convert electrical energy from a grid source or local storage into the specific voltage and current required for charging an electric vehicle battery. The electric vehicle charger 106 includes a plurality of electronic charging components 108. These electronic charging components 108 encompass a range of devices for the charging process, such as transformers for voltage adjustment, rectifiers for AC-to-DC conversion (in DC chargers), inverters for potential DC-to-AC conversion or bidirectional power flow, power factor correction circuitry, filtering elements to ensure power quality, microprocessors or controllers for managing the charging process and communication, and various safety monitoring circuits. In an example, the safety monitoring circuits included within the plurality of electronic charging components 108 monitor parameters such as voltage, current, temperature, and ground fault conditions to ensure safe operation during the charging process and initiate protective shutdowns if unsafe conditions are detected.

The operation of the plurality of electronic charging components 108, particularly during high-power DC fast charging cycles, generates a considerable amount of waste heat due to inherent inefficiencies in power conversion. Effective thermal management is therefore required to maintain the electronic charging components 108 within their optimal operating temperature range, ensuring efficiency, reliability, and longevity. Failure to adequately dissipate this heat can lead to component degradation, reduced charging speeds, premature failure, and potential safety hazards. The underground placement within the charging pod 104 provides a baseline level of thermal stability, but active heat removal is still necessary, especially for high-power chargers.

Figure 1B:
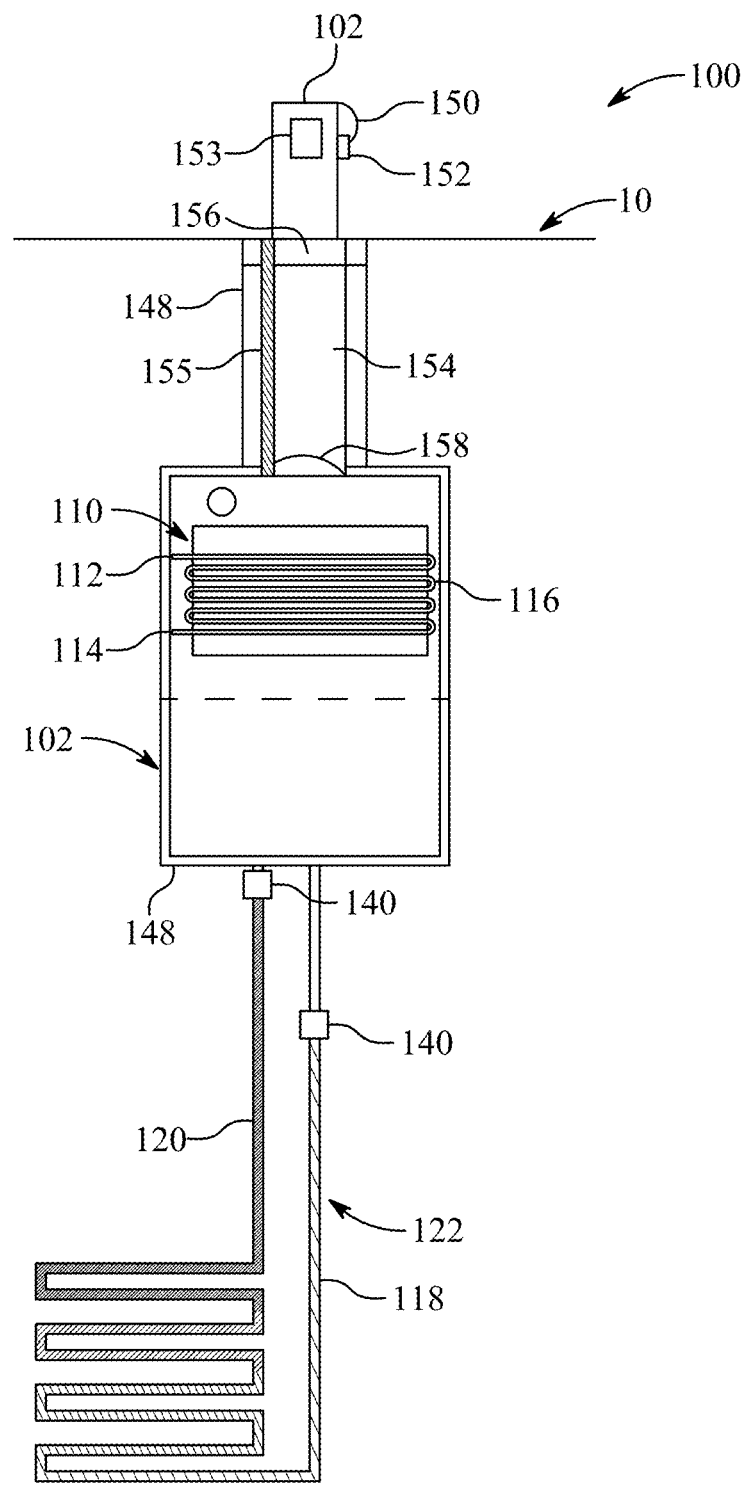
FIG. 1B is a schematic detailed illustration of a cooling system configuration for a single charging pod as shown in FIG. 1A, according to the first embodiment.

As illustrated in FIGS. 1A and 1B in combination, each charging pod 104 further includes a plurality of heat exchange plates 110 located in the electric vehicle charger 106 over the electronic charging components 108 (the electric vehicle charger 106 not visible in FIG. 1B). The function of the heat exchange plates 110 is to efficiently conduct heat away from the surfaces of the electronic charging components 108 and transfer that heat to a circulating coolant (as discussed below). Each heat exchange plate 110 includes a coolant inlet 112 and a coolant outlet 114. The coolant inlet 112 serves as the entry point for the cooled coolant. The coolant outlet 114 serves as the exit point for the coolant after the coolant has flowed through the internal passages of the coils and absorbed heat from the heat exchange plate 110. The physical structure of the heat exchange plate 110, including internal passages in the form of a serpentine coolant coil 116 (detailed further in reference to FIGS. 8A and 8B). Such configuration of the heat exchange plate 110 with the serpentine coolant coil 116 is implemented for maximizing heat transfer surface area and minimizing thermal resistance between the electronic components 108 and the coolant. Herein, the coolant inlet 112 and the coolant outlet 114 are connected to an inlet end and an outlet end respectively of the serpentine coolant coil 116 located on the heat exchange plate 110.

Each charging pod 104 further includes a coolant input line 118 connected to the coolant inlet 112 of each heat exchange plate 110. The coolant input line 118 is the conduit that delivers cooled coolant to the coolant inlet 112 of the heat exchange plate 110. Each charging pod 104 further includes a coolant output line 120 connected to the coolant outlet 114 of each heat exchange plate 110. The coolant output line 120 is the conduit that carries the heated coolant away from the coolant outlet 114 of the heat exchange plate 110. This heated coolant in the coolant output line 120 is then directed for heat rejection into the earth through the geothermal coils.

The charging station 100 further includes a cooling system 122. Herein, each charging pod 104 integrates the electric vehicle charger 106 with the cooling system 122. The cooling system 122 is configured to actively remove heat from the electronic charging components 108 of the electric vehicle charger 106. As illustrated, the cooling system 122 is located within the charging pod 104. In an aspect of the present disclosure, each charging pod 104 includes the electric vehicle charger 106 and the cooling system 122 in a single unit. This integrated single unit contains all the primary operational components for both charging and thermal management specific to one charge terminal 102. Furthermore, such single unit is surrounded by a reinforced concrete enclosure. The reinforced concrete enclosure provides the necessary structural support and environmental protection for the single unit located below the ground 10. This integrated approach simplifies the underground installation by consolidating components within a defined enclosure.

Figure 2:
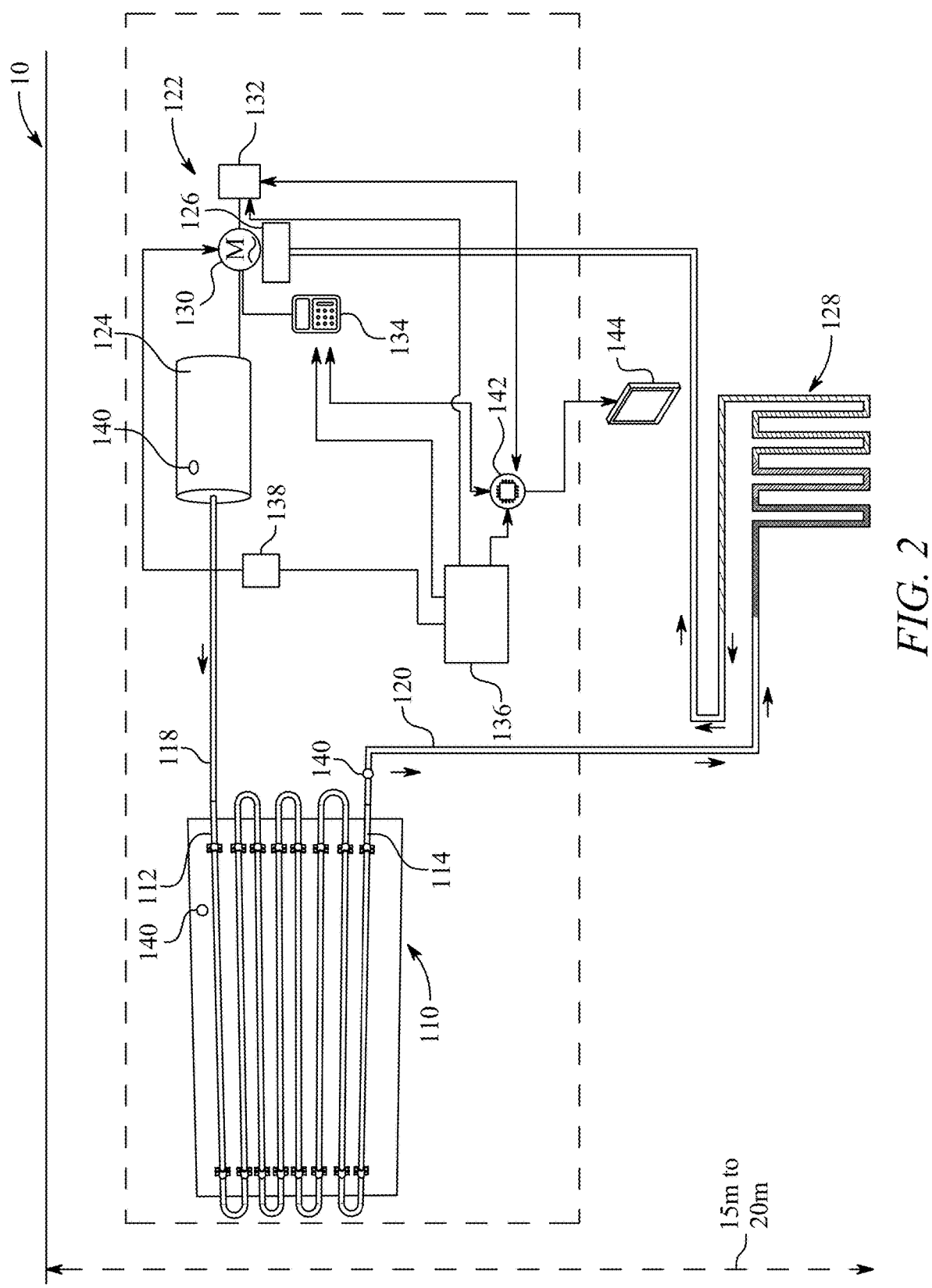
FIG. 2 is a schematic illustration of a cooling system working in conjunction with a charging pod of the charging station, showing its components and a coolant flow path, and its connection to a geothermal coil, for cooling a heat exchange plate, according to certain embodiments.

Referring now to FIG. 2, illustrated is a schematic illustration of the cooling system 122 working in conjunction with the charging pod 104 of the charging station 100. As illustrated, the cooling system 122 includes a coolant supply tank 124. The coolant supply tank 124 is configured to hold a coolant. The coolant supply tank 124 serves as a reservoir for the coolant, accommodates thermal expansion, and helps to buffer coolant temperature. The selection of the coolant fluid circulated within the cooling system 122 is determined based on factors including thermal performance characteristics, operational temperature range, environmental considerations, safety, material compatibility, and cost. In one configuration, the coolant is water. Water offers good heat capacity and thermal conductivity, is readily available, inexpensive, and environmentally safe. In alternative configurations, the coolant is a non-toxic, environmentally friendly coolant selected from the group consisting of water, ammonia, and propylene glycol. Propylene glycol, often used in mixtures with water, serves as an effective antifreeze, lowering the freezing point of the solution and allowing operation in sub-zero conditions without risk of freezing damage. Ammonia also possesses favorable thermodynamic properties for heat transfer. The choice among these options allows for tailoring the coolant properties to the specific environmental conditions and regulatory requirements of the installation site while prioritizing safety and environmental compatibility.

The cooling system 122 further includes a coolant pump 126. The coolant pump 126 provides the motive force to circulate the coolant. The cooling system 122 further includes associated piping which connects these components into a closed loop with the heat-absorbing and heat-rejecting elements thereof. In the present configuration, the cooling system 122 utilizes the coolant, which is circulated by the coolant pump 126 to absorb heat from the electronic charging components 108 via heat exchange plates (detailed below). The coolant, now heated, is then directed out of the charging pod 104 to a heat rejection element.

In the charging station 100 of the present disclosure, the cooling system 122 includes a plurality of geothermal coils 128, which serves as the heat rejection element. The geothermal coils 128 are in the form of loops of pipe buried deep underground, providing a large surface area for heat exchange with the surrounding earth. The plurality of geothermal coils 128 are installed at a significant depth below the ground 10. In a hot or temperate climate, the plurality of geothermal coils 128 are buried at a below ground depth in a range of about 15 m to about 20 m. This depth is chosen because the earth's temperature at this level remains remarkably stable throughout the year, typically hovering around the mean annual air temperature, and is substantially cooler than peak summer surface temperatures in many regions. For example, while surface temperatures might exceed 40° C. or 50° C., the ground temperature at 15-20 meters might remain consistently between 15° C. and 20° C. This stable, relatively cool subterranean environment acts as a highly effective and energy-efficient heat sink.

Alternatively, in an extremely cold climate, such as those above the frost line, the below ground depth may be several hundred meters.

The plurality of geothermal coils 128 are fluidly connected within the cooling loop of the charging station 100. Specifically, a first end of the geothermal coils 128 is connected to the coolant output line 120 and a second end of the geothermal coils 128 is connected to the coolant pump 126. In the charging station 100, heated coolant flowing from the charging pod 104 enters the geothermal coils 128. As the coolant circulates through the buried pipes of the geothermal coils 128, heat is transferred from the warmer coolant to the cooler surrounding earth mass via conduction. The coolant, having rejected its absorbed heat, becomes significantly cooler and is then returned to the cooling system 122 (e.g., the coolant supply tank 124) to begin the heat absorption cycle over again. The continuous flow of the coolant through the coolant input line 118 and the coolant output line 120 of each charging pod 104, driven by the coolant pump 126, establishes the active heat transport mechanism. This continuous circulation allows for sustained removal of heat generated by the electronic charging components 108. The substantial depth of the geothermal coils 128 ensures consistent cooling performance regardless of diurnal or seasonal variations in surface weather conditions.

In an aspect of the present disclosure, the serpentine cooling coil 116, the coolant input line 118, the coolant output line 120 and the geothermal coils 128 are made from high-density polyethylene (HDPE). HDPE is well-suited for these applications due to its high resistance to corrosion from soil chemicals and common coolants like water and propylene glycol mixtures. HDPE also exhibits good resistance to abrasion, which is beneficial during installation and operation, particularly for the buried the plurality of geothermal coils 128. Furthermore, HDPE offers sufficient flexibility for forming the serpentine coolant coil 116 and for installing the plurality of geothermal coils 128 in various configurations (horizontal, vertical, looped), while possessing adequate pressure ratings and a long expected service life under the typical temperature and pressure conditions encountered in such closed-loop geothermal systems.

Further, in an aspect of the present disclosure, the coolant input line 118, the coolant output line 120, and the plurality of geothermal coils 128 are double walled pipes. This construction involves an inner pipe carrying the primary flow of the coolant, surrounded by an outer pipe that creates an annular space between the two walls. In an example, the proposed double-walled pipes may use plastic pressure pipe materials of high-density polyethylene (HDPE), polyvinyl chloride (PVC), chlorinated polyvinyl chloride (CPVC), polypropylene (PP), polyvinylidene fluoride (PVDF), and ethylene chlorotrifluoroethylene copolymer (ECTFE). Such double-wall design provides secondary containment. If the inner pipe develops a leak, the outer pipe prevents the immediate release of the coolant into the surrounding soil. This double-walled structure also provides increased mechanical strength and protection against physical damage during installation or from ground settling and may offer a degree of thermal insulation for the coolant lines 118, 120 as they traverse different soil temperature zones. The interstitial space between the inner and outer walls may optionally be monitored by leak detection sensors to provide early warning of any breach in the inner pipe integrity.

The overall coolant circulation path shown in FIG. 2 proceeds as follows. The coolant pump 126 draws relatively cool coolant from the coolant supply tank 124. The coolant pump 126 pressurizes the coolant and pushes the coolant into the coolant input line 118. The coolant flows through the coolant input line 118 to cool the heat exchange plate 110, entering via the coolant inlet 112. The heat exchange plate 110 absorbs heat from the coolant. The now-heated coolant exits via the coolant outlet 114 into the coolant output line 120. The coolant output line 120 carries the heated coolant to the geothermal coils 128. After rejecting heat in the geothermal coils 128 to the ground, the cooled coolant returns to the coolant supply tank 124, ready to be recirculated by the coolant pump 126.

The operation of the coolant pump 126 is controlled by associated components. For this purpose, the charging station 100 includes a reversible motor 130 connected to the coolant pump 126. The reversible motor 130 provides the mechanical power to drive the coolant pump 126. The charging station 100 further includes a variable flow device 132 connected to a coolant pump input pipe (i.e., on inlet of the coolant pump 126). The speed of the reversible motor 130, and thus the flow rate generated by the coolant pump 126, is regulated by the variable flow device 132, such as a variable frequency drive (VFD) or similar motor controller. This allows the cooling capacity to be adjusted based on the actual thermal load. The charging station 100 further includes an ultrasonic flow meter 134 connected to a coolant pump output pipe (i.e., on outlet of the coolant pump 126). The ultrasonic flow meter 134 is configured to generate pressure measurement signals of a coolant flow in the coolant pump output pipe. Specifically, the ultrasonic flow meter 134 generates electrical signals (e.g., pulse, analog 4-20 mA, or digital RS485) representing the measured parameter. The ultrasonic flow meter 134 is incorporated into the coolant path for real-time measurement of the coolant flow rate or pressure, thereby providing feedback for proper control of the cooling system 122.

The charging station 100 further includes a power supply 136 connected through a relay 138 to the reversible motor 130. The power supply 136 provides the electrical energy to operate the reversible motor 130. In the present configuration, the power supply 136 also provides the electrical energy to operate the variable flow device 132, the ultrasonic flow meter 134, control electronics, and any associated sensors. The relay 138, as used herein, is generally a solid-state switching device, which is used to switch power to the reversible motor 130. The charging station 100 further includes a plurality of temperature sensors 140. Each temperature sensor 140 is configured to perform temperature measurements and generate temperature measurement signals. The temperature sensors 140 are disposed at various strategic locations in each charging pod 104 to provide the respective temperature measurements (as discussed in more detail, later in the description).

The charging station 100 further includes a computing device 142 located within each charging pod 104. The computing device 142 is operatively connected to the reversible motor 130, the variable flow device 132, the ultrasonic flow meter 134 and the power supply 136. In present configuration, the computing device 142 may be implemented as an embedded controller (in a non-limiting example, a Raspberry Pi®, available from Raspberry Pi LTD, Pencoed, South Wales, United Kingdom) or a dedicated industrial controller. The computing device 142 includes an electrical circuitry, a memory configured to store program instructions and at least one processor configured to execute the program instructions. In some examples, the charging station 100 may further include an external monitor 144. Connection ports, for example, HDMI and USB ports, may allow for connection of the external monitor 144 for diagnostics or configuration.

In the charging station 100, the computing device 142 is responsible for orchestrating the entire cooling process. The computing device 142 executes control software, receives sensor inputs (e.g., the ultrasonic flow meter 134 and the temperature sensors 140), processes this information according to control algorithms, and sends output signals to actuators such as the variable flow device 132 and the relay 138 to effectively manage operation of the cooling system 122. The hardware and software details of the computing device 142 are discussed in the description in reference to FIGS. 13-16.

The plurality of temperature sensors 140, utilized by the computing device 142 for monitoring and control, are strategically positioned to provide comprehensive thermal data about the charging station 100. Specifically, the plurality of temperature sensors 140 comprise distinct types based on their location and function. In an aspect of the present disclosure, the plurality of temperature sensors 140 includes a heat exchange plate temperature sensor located within each charging pod 104. The heat exchange plate temperature sensor is located within each charging pod 104, typically mounted directly onto or in close proximity to the heat exchange plate 110 and provides measurement representative of the operating temperature of the plurality of electronic charging components 108, serving as the input for the computing device 142 to determine whether to activate the cooling mode or the warming mode. The plurality of temperature sensors 140 further includes a coolant outlet temperature sensor located at each coolant outlet 114. The coolant outlet temperature sensor is located at each coolant outlet 114 of the heat exchange plate 110 and measures the temperature of the coolant after the coolant has absorbed heat while passing through the serpentine coolant coil 116, providing information regarding the rate of heat absorption occurring at the heat exchange plate 110. This data can be used by the computing device 142, potentially in conjunction with flow rate data from the ultrasonic flow meter 134, to assess the thermal load being managed and potentially optimize the coolant flow rate for efficiency. The plurality of temperature sensors 140 further includes a coolant tank temperature sensor located in each coolant supply tank 124. The coolant tank temperature sensor measures the bulk temperature of the coolant within the coolant supply tank 124, which typically represents the temperature of the coolant returning from the plurality of geothermal coils 128 before the coolant is recirculated by the coolant pump 126. The measurement from the coolant tank temperature sensor indicates the effectiveness of the heat rejection process occurring in the plurality of geothermal coils 128 (in cooling mode) or the heat absorption process (in warming mode), as discussed below. The computing device 142 can utilize this temperature information to further refine control decisions or for diagnostic purposes regarding the performance of the geothermal loop.

Referring back to FIG. 1B, the diagram shows components associated with a single charging pod 104 and the corresponding charge terminal 102 (located above the ground 10) in the charging station 100, consistent with the embodiment depicted in FIG. 1A. As shown, the charging station 100 includes a charging cable 150 having a first end connected to the electronic charging components 108 of the electric vehicle charger 106. Further, a second end of the charging cable 150 is connected to the charge terminal 102. The charging station 100 further includes a charge plug 152 located on the charge terminal 102. The charge plug 152 is configured to connect to a charge socket of an electric vehicle. In the present configurations, each charge plug 152 is configured to deliver a DC fast charge to the charge socket of the electric vehicle. In some examples, the charging station 100 may also incorporate a display 153 having a credit card terminal for user interaction or information presentation. In an example, the credit card terminal may be a wireless terminal able to accept a card swipe or read a bar code on a smartphone display which gives access to a user's account. Alternately, the credit card terminal may be a conventional pin pad with swipe, insert, tap and/or scan features.

In an aspect of the present disclosure, the charging station 100 includes an underground enclosure 148 configured to surround the electric vehicle charger 106, the coolant supply tank 124, the coolant pump 126, the reversible motor 130, the variable flow device 132 and the ultrasonic flow meter 134. The underground enclosure 148 provides structural support against soil pressure and environmental isolation to the components enclosed therein. The underground enclosure 148 is located at a depth of about one meter to three meters below ground 10. The underground enclosure 148 is constructed from reinforced concrete, a composite material combining the compressive strength of concrete with the tensile strength of embedded steel reinforcement (rebar). This construction ensures long-term structural integrity and resistance to subterranean conditions, including moisture and soil chemistry. In certain configurations, the plurality of charging pods 104 are located below ground at a depth in a range of about one meter to about three meters. Herein, each charging pod 104 may also be situated within the underground enclosure 148. Therefore, the charging pods 104 are placed at a depth determined to provide significant thermal buffering, insulating the internal components from extreme ambient temperatures and direct solar radiation. The underground placement leverages the stable thermal environment of the subsurface earth, contributing significantly to the effectiveness of the geothermal cooling approach by reducing the initial heat load on the cooling system 122.

Further, as shown, the charging station 100 includes a plurality of access shafts 154. Each access shaft 154 is configured to connect between the surface of the ground 10 and a respective single unit. Furthermore, each access shaft 154 is configured to connect between the surface of the ground 10 and a respective charging pod 104. The access shaft 154 provides vertical access from the ground 10 down to the charging pod 104. Herein, each access shaft 154 is encased in reinforced concrete. The access shaft 154 is constructed from the reinforced concrete for structural integrity. In some examples, an access cover 156 may be positioned at the ground 10 to provide entrance to the access shaft 154. Further, an access port 158 may be provided to facilitate the passage of connections, and control or communication wiring, between the access shaft 154 and the interior of the charging pod 104.

Further, FIGS. 1A and 1B depict the charging pod 104 in greater detail, illustrating the internal arrangement of the electric vehicle charger 106, including the plurality of electronic charging components 108, and the cooling system 122 integrated within the same housing. The heat exchange plate 110 (representing the plurality of heat exchange plates) is shown positioned directly over the electronic charging components 108, facilitating efficient heat transfer. The temperature sensor 140 is shown located within the charging pod 104, positioned proximate to the heat exchange plate 110 or the electronic charging components 108 and configured to perform temperature measurements representative of the thermal state of the electronic charging components 108.

The lower section of the charging pod 104 houses components of the cooling system 122, including the coolant pump 126, the coolant supply tank 124, and associated pipes (including the coolant input line 118 and the coolant output line 120). The coolant output line 120 extends from the charging pod 104 downwards towards the plurality of geothermal coils 128. A sensor unit, as part of the temperature sensor 140, configured to measure pressure and temperature of the coolant, is installed on the coolant output line 120 after the line exits the charging pod 104. The sensor unit provides measurement signals regarding the state of the heated coolant before the coolant enters the plurality of geothermal coils 128. In some examples, the piping extending below the charging pod 104 towards the plurality of geothermal coils 128 may also be encased in reinforced concrete 168.

The plurality of geothermal coils 128 are shown schematically located at a depth below the charging pod 104, representing the installation within the ground at the specified depth range (e.g., 15 m to 20 m). The coolant output line 120 fluidly connects to the inlet of the plurality of geothermal coils 128. As depicted, the coolant flows through the loops of the plurality of geothermal coils 128, where heat exchange with the surrounding earth occurs. A return pipe (coolant input line 118) conveys the cooled coolant from the outlet of the plurality of geothermal coils 128 back towards the cooling system 122 (specifically, towards the coolant pump 126, via the coolant supply tank 124) located within the charging pod 104, completing the fluid circuit.

Referring back to FIG. 2, the cooling system 122 is schematically illustrated, working in conjunction with the charging pod 104 of the charging station 100. FIG. 2 depicts components of the cooling system 122 and a coolant flow path configured for cooling the heat exchange plate 110 thereby. This represents the primary operational mode when the electronic charging components 108 generate significant heat, such as during high-power charging or under high ambient temperature conditions, requiring active heat removal. The cooling system 122 operates to transfer thermal energy from the heat exchange plate 110, which is in thermal contact with the electronic charging components 108, to the plurality of geothermal coils 128 for rejection into the surrounding earth.

In this cooling mode, the coolant, having been previously cooled by circulation through the plurality of geothermal coils 128, resides in or flows towards the coolant supply tank 124. The coolant pump 126, driven by the reversible motor 130 operating in a forward direction as determined by the computing device 142, draws this cool coolant from the coolant supply tank 124 via the coolant pump input pipe. The coolant pump 126 increases the pressure of the coolant and discharges the coolant into the coolant pump output pipe, which directs the coolant into the coolant input line 118 leading to the heat exchange plate 110.

The cooled coolant enters the heat exchange plate 110 through the coolant inlet 112 and flows through the internal passages defined by the serpentine coolant coil 116. As the coolant traverses this path across the heat exchange plate 110, the coolant absorbs thermal energy conducted from the electronic charging components 108 to the heat exchange plate 110. Having absorbed this heat, the now-heated coolant exits the heat exchange plate 110 via the coolant outlet 114 and flows into the coolant output line 120.

The coolant output line 120 transports the heated coolant away from the charging pod 104 towards the plurality of geothermal coils 128 buried deep underground. As the heated coolant circulates through the plurality of geothermal coils 128, heat is transferred from the warmer coolant to the cooler surrounding earth mass. This heat transfer process is indicated conceptually by the temperature gradient and the heat rejection arrows in FIG. 2. Consequently, the coolant temperature decreases significantly as the coolant passes through the plurality of geothermal coils 128. The cooled coolant then returns from the outlet of the plurality of geothermal coils 128 back towards the coolant supply tank 124, completing the circulation loop and readying the coolant for another heat absorption cycle.

The operation of the cooling system 122 in this cooling mode is governed by the computing device 142. The computing device 142 is configured to receive power from the power supply 136. The computing device 142 is further configured to receive the temperature measurement signals from the plurality of temperature sensors 140, particularly the heat exchange plate temperature sensor located near the electronic charging components 108. The computing device 142 is further configured to receive pressure measurement signals from the ultrasonic flow meter 134. The computing device 142 is further configured to receive flow measurement signals from the variable flow device 132. The computing device 142 is further configured to compare the temperature measurement signals to a temperature threshold. The computing device 142 compares these measured temperatures to a predetermined upper temperature threshold stored in the memory thereof.

The computing device 142 is further configured to actuate the reversible motor 130 to pump coolant to the coolant inlet 112 to lower the temperature of the heat exchange plates 110 when the temperature measurement signals exceed the temperature threshold. That is, if the measured temperature exceeds the upper temperature threshold, indicating a need for cooling, the computing device 142 actuates the reversible motor 130 (via the relay 138 and potentially controlled by the variable flow device 132) to operate the coolant pump 126 in the forward direction, thereby initiating or maintaining the coolant circulation described above. Herein, the computing device 142 utilizes the pressure measurement signals from the ultrasonic flow meter 134 and the flow measurement signals associated with the variable flow device 132 to modulate the speed of the coolant pump 126 via the variable flow device 132, thereby adjusting the flow rate to optimize heat removal and maintain stable system operation. The power supply 136 provides the necessary energy for the computing device 142 and all actuated components.

Figure 3:
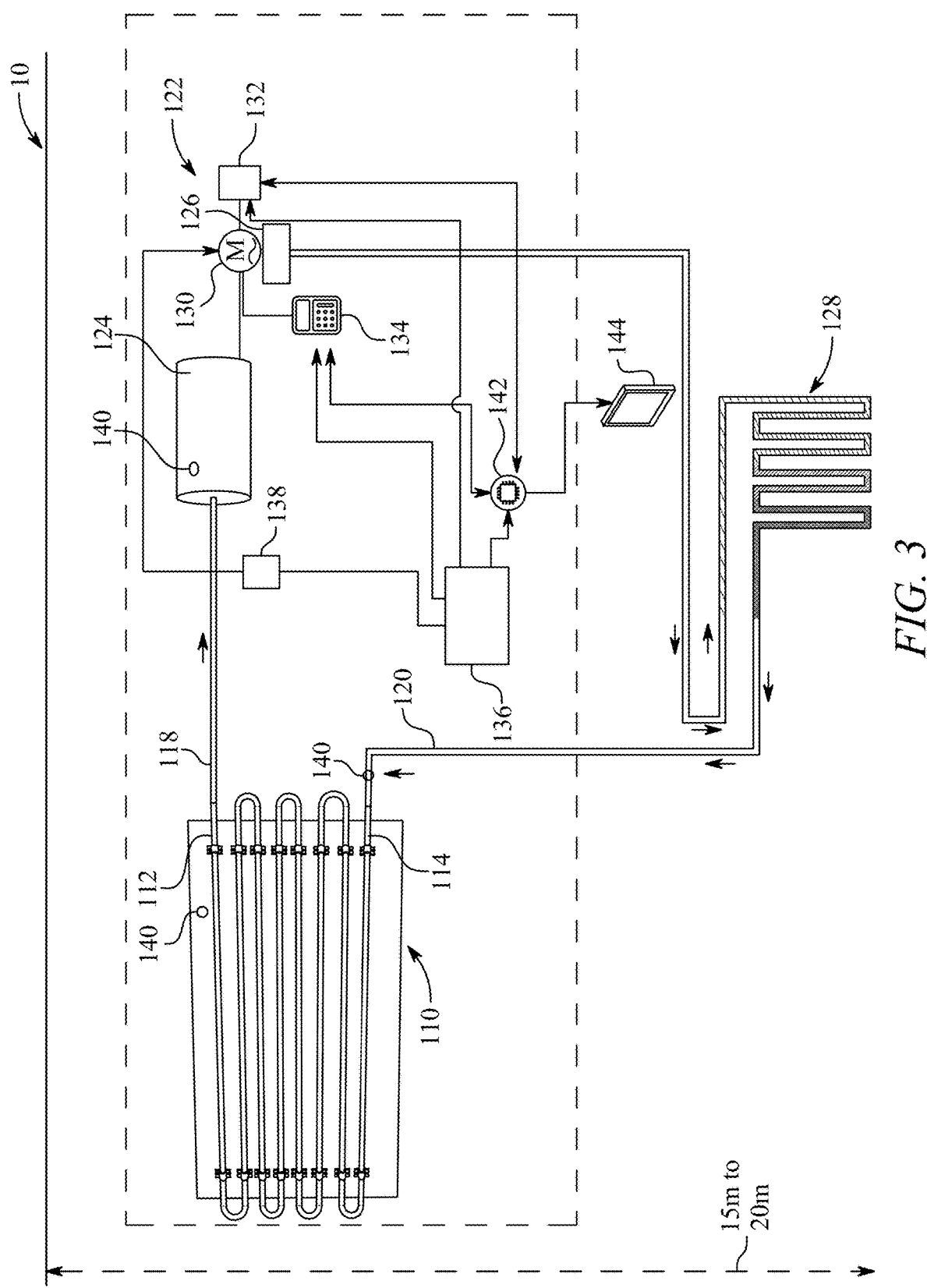
FIG. 3 is a schematic illustration of a cooling system working in conjunction with a charging pod of the charging station, showing its components and a coolant flow path, and its connection to a geothermal coil, for warming a heat exchange plate, according to certain embodiments.

FIG. 3 is a schematic illustration of the cooling system 122 working in conjunction with the charging pod 104, depicting a coolant flow path configured for warming the heat exchange plate 110. This operational mode is relevant under low ambient temperature conditions where the electronic charging components 108 might otherwise fall below a minimum preferred or safe operating temperature. This mode utilizes the stable temperature of the deep earth, accessed via the plurality of geothermal coils 128, as a source of heat, leveraging the fact that the deep earth temperature (e.g., 15-20° C.) is often significantly warmer than very cold surface temperatures.

In this warming mode, the computing device 142, upon receiving the temperature measurement signals from the plurality of temperature sensors 140 indicating that the temperature near the heat exchange plate 110 has fallen below a predetermined lower temperature threshold, initiates a warming sequence. Herein, the computing device 142 is configured to actuate the reversible motor 130 to pump coolant to the plurality of geothermal coils 128 to raise the temperature of the heat exchange plates 110 when the temperature measurement signals are less than the temperature threshold. That is, the computing device 142 actuates the reversible motor 130 to operate the coolant pump 126 in a manner that facilitates heat transfer from the plurality of geothermal coils 128 to the heat exchange plate 110. This typically involves the computing device 142 commanding the reversible motor 130 to rotate in the reverse direction compared to the cooling mode.

With the coolant pump 126 operating in reverse (or through appropriate valve switching if implemented), the coolant flow path is altered. Coolant is circulated through the plurality of geothermal coils 128 where the coolant absorbs heat from the relatively warmer surrounding earth mass, as indicated by the conceptual temperature gradient and heat absorption arrows in FIG. 3 (in contrast to FIG. 2). This warmed coolant is then drawn by the coolant pump 126 and directed towards the heat exchange plate 110. As the warmer coolant flows through the serpentine coolant coil 116 within the heat exchange plate 110, the coolant releases heat to the heat exchange plate 110, thereby increasing the temperature of the heat exchange plate 110 and the attached electronic charging components 108. The now-cooled coolant then returns to the plurality of geothermal coils 128 to absorb more heat, completing the warming cycle.

The computing device 142 monitors the temperature using the plurality of temperature sensors 140 and controls the operation of the reversible motor 130 and the variable flow device 132 to maintain the temperature of the electronic charging components 108 above the lower threshold, effectively using the geothermal connection as a heat source. The ability to operate in both cooling mode (as per FIG. 2) and warming mode (as per FIG. 3), enabled by the reversible motor 130 and the adaptive control implemented by the computing device 142 utilizing feedback from the variable flow device 132, the ultrasonic flow meter 134, and the plurality of temperature sensors 140, ensures that the charging station 100 can maintain reliable operation across a broad spectrum of environmental temperature conditions. The lower threshold may be about 10 degrees Celsius.

Figure 4:
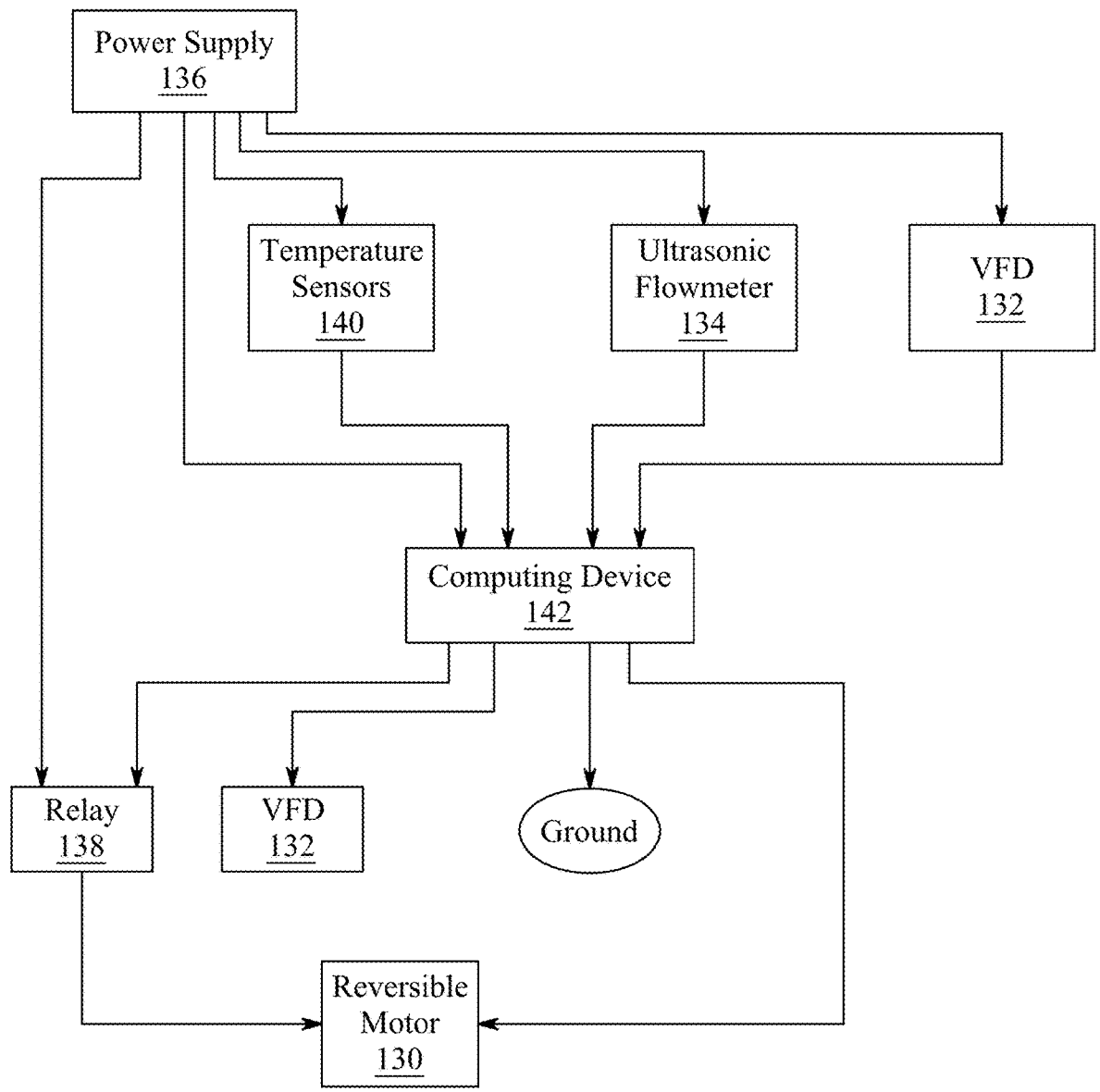
FIG. 4 is a block diagram illustration of a charging station showing its components and signal transfer therebetween, according to certain embodiments.

FIG. 4 is a schematic block diagram illustrating operation of the computing device 142 in conjunction with other components and signal transfers therebetween, within the charging station 100. This diagram details the operative connections enabling the computing device 142 to monitor and regulate the cooling system 122. The power supply 136 serves as the primary source of electrical energy for the control system and associated components. The power supply 136 provides power directly to the computing device 142, the variable flow device 132, the ultrasonic flow meter 134, the plurality of temperature sensors 140, and also provides the main power input that is switched by the relay 138 to operate the reversible motor 130. The computing device 142 also has connections for ground or power return paths.

The computing device 142 functions as the central processing unit for the control logic. The computing device 142 receives input signals from various sources. The temperature measurement signals are received from the plurality of temperature sensors 140, providing thermal status information. The pressure measurement signals are received from the ultrasonic flow meter 134, providing data on the coolant flow dynamics within the coolant pump output pipe. The feedback signals are received from the variable flow device 132, indicating the operational status, speed, or power consumption of the variable flow device 132 or the reversible motor 130 under the control of the variable flow device 132.

Based on these received input signals and the program instructions stored in the memory thereof, the computing device 142 generates several output control signals. A control signal is sent to the relay 138 to switch the main power supply to the reversible motor 130, effectively turning the reversible motor 130 on or off. A control signal is sent to the variable flow device 132, instructing the variable flow device 132 to modulate the speed or operation of the reversible motor 130, thereby adjusting the coolant flow rate. A direction/control signal is sent directly to the reversible motor 130 (or its controller integrated with the variable flow device 132) to control the direction of rotation, enabling switching between the cooling mode (FIG. 2) and the warming mode (FIG. 3).

Such configuration enables the computing device 142 to implement closed-loop control strategies. Specifically, regarding pressure regulation, the computing device 142 is configured to receive the pressure measurement signals from the ultrasonic flow meter 134. The computing device 142 executes instructions to subtract an amplitude of the received pressure measurement signals from a predetermined pressure setpoint (stored in the memory thereof). This calculation provides a difference value representing the deviation from the desired pressure. Based on this calculated difference, the computing device 142 is configured to generate an error correction signal. The magnitude and sign of the error correction signal indicate the extent and direction of the deviation from the pressure setpoint. The computing device 142 is further configured to transmit the generated error correction signal to the variable flow device 132.

Herein, the variable flow device 132, upon receiving the error correction signal, is configured to adjust a pressure of a flow of coolant to the coolant pump 126 when a magnitude of the error correction signal is not equal to the pressure setpoint. That is, the variable flow device 132 adjusts the operation of the coolant pump 126 (by controlling the reversible motor 130) in a manner that seeks to minimize the pressure deviation. Specifically, the variable flow device 132 is configured to adjust the flow rate, which consequently affects the pressure dynamics throughout the coolant circuit, including potentially adjusting the pressure of the flow of coolant entering the coolant pump 126, when the magnitude of the error correction signal indicates that the measured pressure is not equal to the pressure setpoint. This feedback loop ensures that the coolant circulation is maintained at or near the desired operating pressure or flow conditions for stable and efficient thermal regulation. In an aspect, the range of operating temperatures of the electronic components is between a low temperature threshold of about 10 degrees Celsius and a high temperature threshold of about 30 degrees Celsius, preferably about 15 degrees Celsius to about 20 degrees Celsius. In another aspect, the range of operating pressures in the coolant circuit at coolant input line 118 is between about 50 psi and about 70 psi, preferably about 55 psi and about 65 psi, and about 60 psi.

Figure 5:
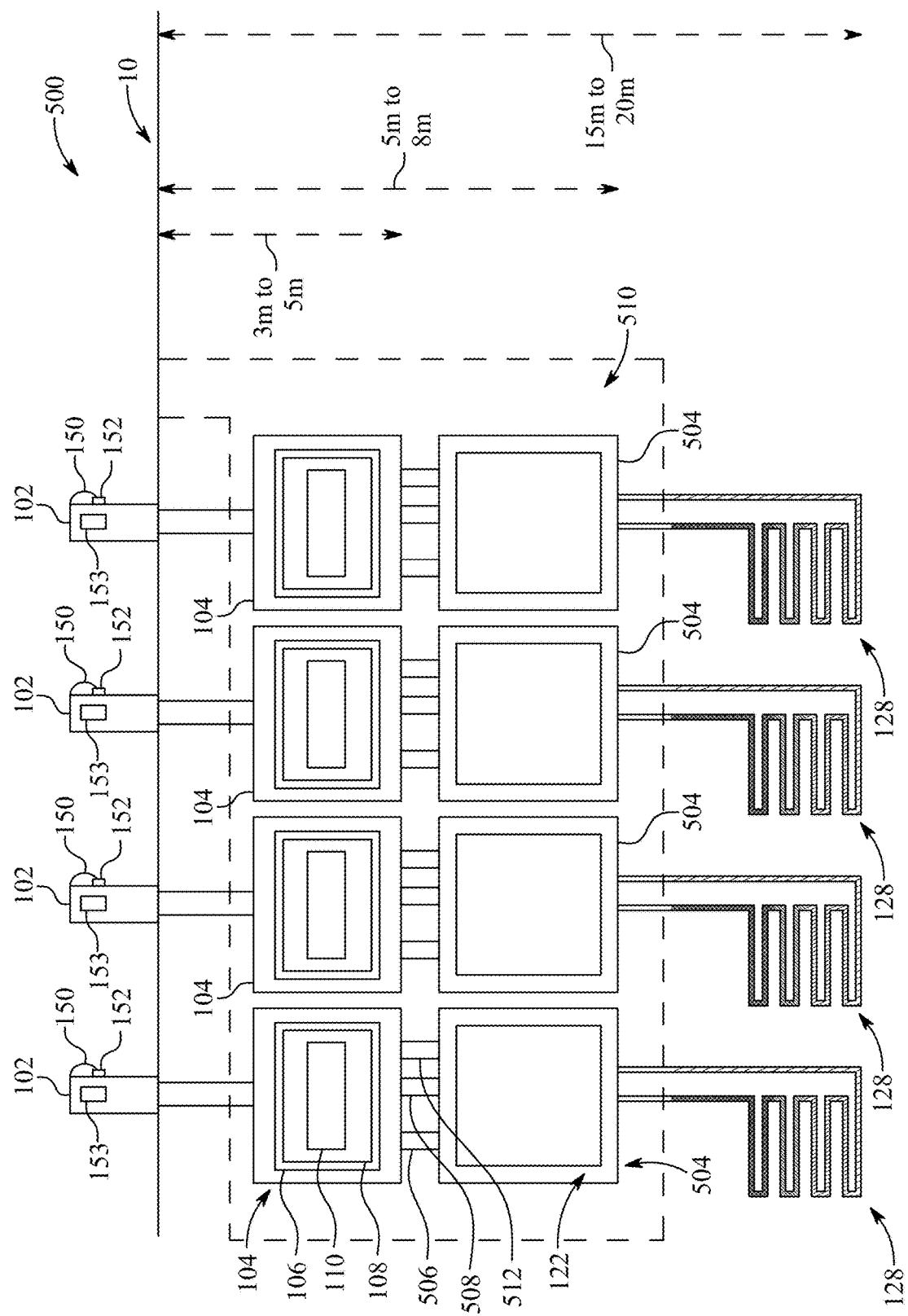
FIG. 5 is a schematic illustration of a charging station, with electronic charging components housed in underground pods and cooling system components located separately underground, and connected to a geothermal coil, according to certain embodiments.

Referring now to FIG. 5, illustrated is a schematic illustration of a charging station 500, according to a second embodiment. In this configuration, the charging station 500 includes the plurality of charge terminals 102 located above the ground 10, and the plurality of charging pods 104 located below the ground 10. Each charging pod 104 contains the electric vehicle charger 106 including the plurality of electronic charging components 108 and the plurality of heat exchange plates 110. However, unlike the first embodiment, the components of the cooling system 122, specifically the coolant pump 126 and the coolant supply tank 124, are not located within each charging pod 104. Instead, these components are situated in a separate underground location or enclosure 504. A network of coolant input lines 506 delivers cooled coolant from the separate location 504 (specifically from the discharge of the coolant pump 126 located therein) to the coolant inlet 112 of the heat exchange plate 110 within each charging pod 104. Correspondingly, a network of coolant output lines 508 carries heated coolant from the coolant outlet 114 of the heat exchange plate 110 within each charging pod 104 towards the plurality of geothermal coils 128 (potentially via the separate location 504). This arrangement centralizes the main pumping and reservoir components while keeping the heat absorption function localized within each charging pod 104. A common access shaft 510 may provide access to the separate enclosure 504, and an electric cable 512 may connect each charge terminal 102 to the respective the charging pod 104.

Figure 6:
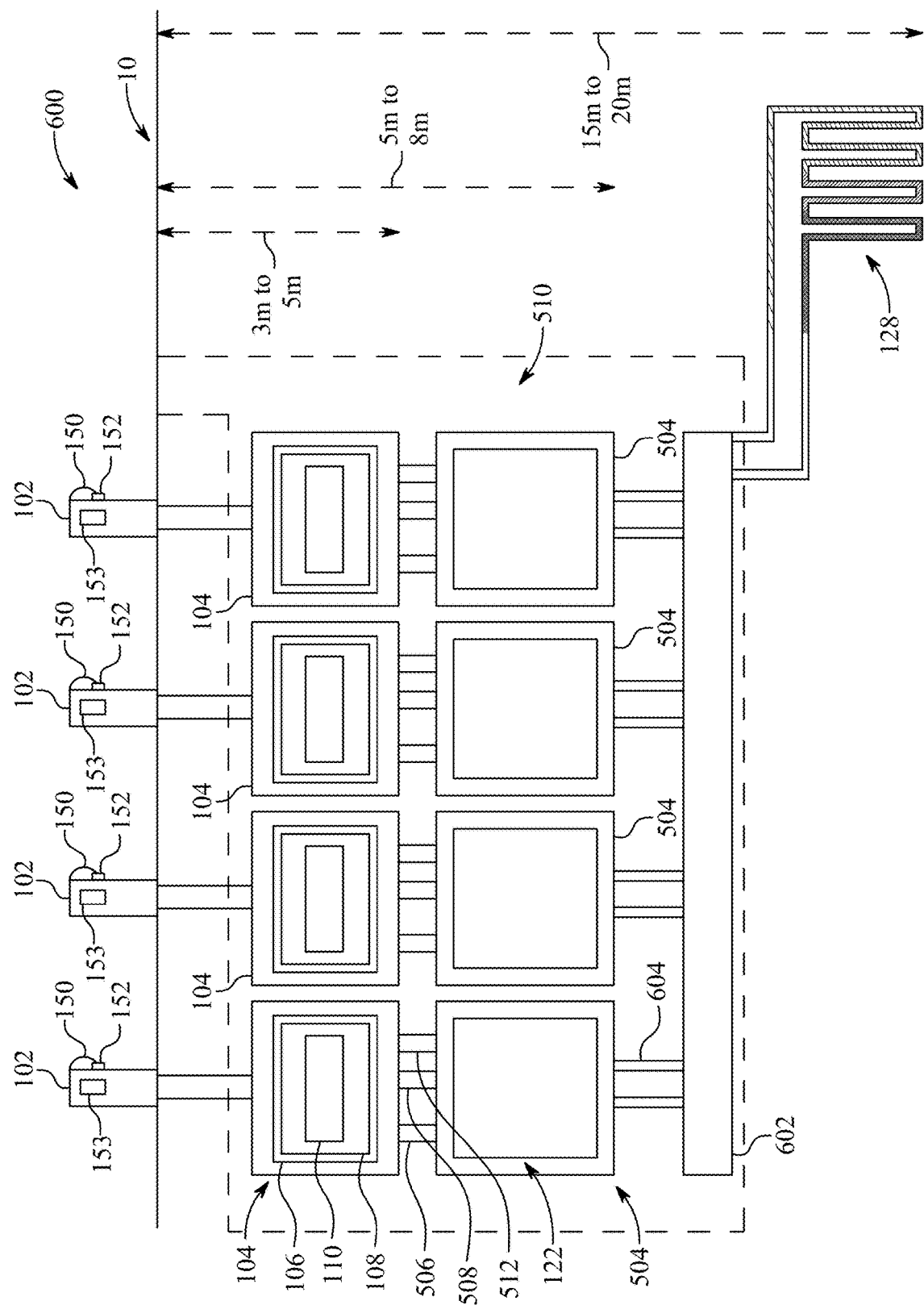
FIG. 6 is a schematic illustration of a charging station with multiple underground charging pods connected via a common manifold to a geothermal coil, according to certain embodiments.

FIG. 6 illustrates a schematic of a charging station 600, according to a third embodiment. In this configuration, the charging station 600 includes the plurality of charge terminals 102 above the ground 10 and the plurality of charging pods 104 below the ground 10. Similar to the first embodiment, each charging pod 104 in this configuration integrates the electric vehicle charger 106 with the electronic charging components 108 and the heat exchange plates 110, as well as the cooling system 122 including the coolant pump 126 and the coolant supply tank 124. The distinction lies in the configuration of the heat rejection loop. The charging station 600 includes a common manifold 602. The charging station 600 further includes coolant output lines 604 carrying heated coolant from each individual charging pod 104 to the common manifold 602. The common manifold 602 aggregates the heated coolant flow from all connected charging pods 104 and directs the combined flow into a single, shared field comprising the plurality of geothermal coils 128, which is buried at the required depth (e.g., 15 m to 20 m). After heat rejection occurs in the shared plurality of geothermal coils 128, the cooled coolant is returned via appropriate piping back to the respective coolant supply tank 124 within each charging pod 104. This configuration allows multiple independent cooling loops to utilize a common geothermal heat exchanger installation.

Figure 7:
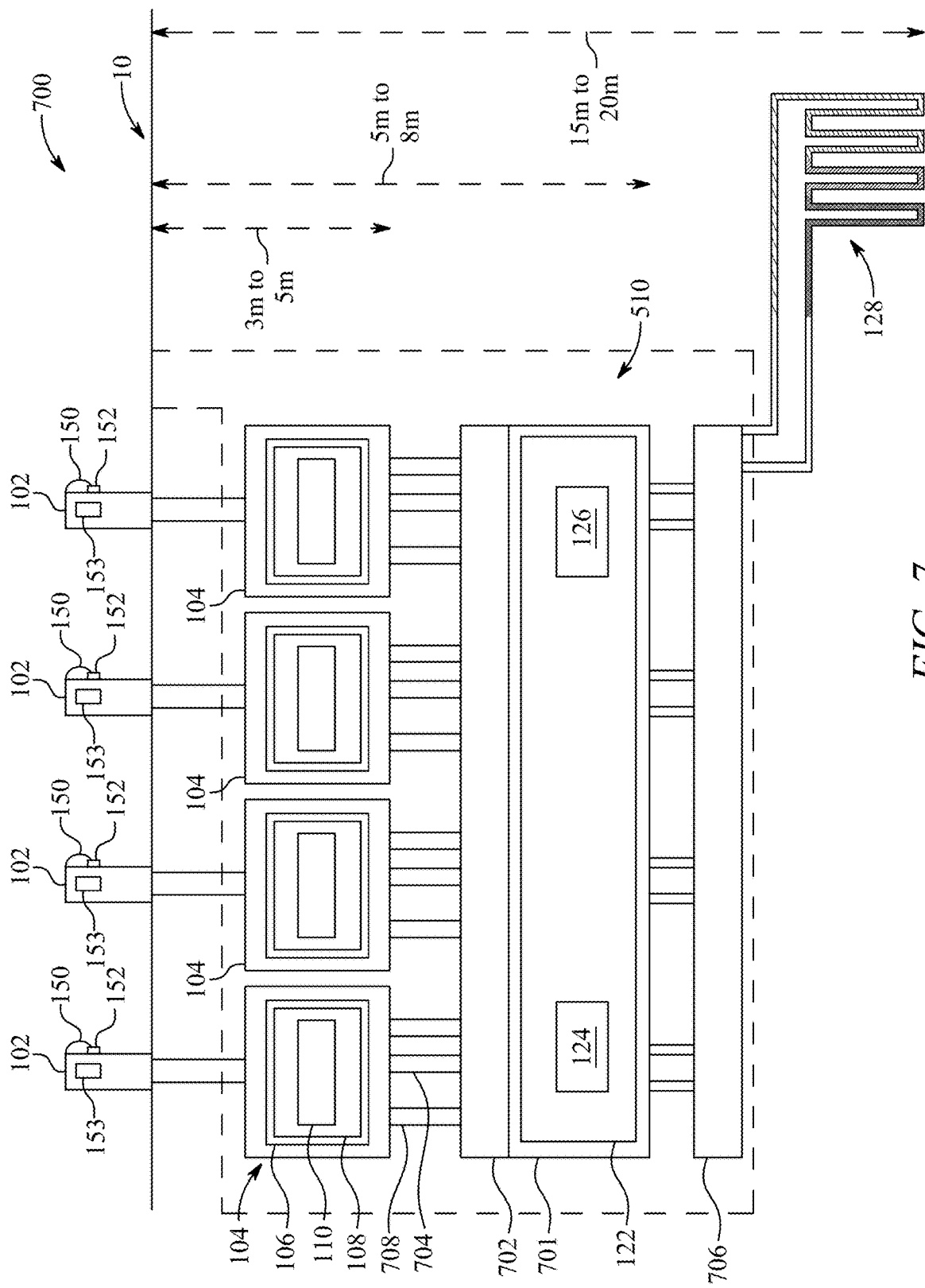
FIG. 7 is a schematic illustration of a charging station with multiple underground charging pods sharing common cooling system components and connected via a common manifold to a geothermal coil, according to certain embodiments.

FIG. 7 illustrates a schematic illustration of a charging station 700, according to a fourth embodiment, representing a fully centralized cooling architecture. The charging station 700 includes the plurality of charge terminals 102 and the plurality of charging pods 104 containing the electric vehicle chargers 106, the electronic charging components 108, and the heat exchange plates 110. In this configuration, both the cooling system 122 (including the coolant pump 126 and the coolant supply tank 124) and the plurality of geothermal coils 128 are shared resources, centrally located rather than distributed among the charging pods 104. The cooling system 122 is housed within a shared enclosure 701. Heated coolant flows from each charging pod 104 to a first manifold 702 via a coolant output line 704, which collects the flow and directs the flow towards the shared enclosure or directly to the inlet of the shared plurality of geothermal coils 128. The shared coolant pump 126 circulates the coolant through the shared plurality of geothermal coils 128 for heat rejection. Cooled coolant returning from the plurality of geothermal coils 128 flows back to the shared enclosure (e.g., the coolant supply tank 124). A second manifold 706 then distributes the centrally cooled coolant via individual coolant input lines 708 back to the coolant inlet 112 of the heat exchange plate 110 within each charging pod 104. This configuration consolidates both the heat rejection function and the circulation mechanism, potentially offering installation and maintenance efficiencies for large-scale deployments.

In the embodiments of FIGS. 5, 6 and 7, the access shaft 510 must have dimensions which are large enough to allow a service technician to enter and service the charging pods 104. In a non-limiting example, the access shaft may be about 9 meters deep below ground, have a length at least a meter greater than the assembly of charging pods 104 and a depth of about 2 meters. The access shaft should be surrounded by the reinforced concrete enclosing the entire underground structure (other than the geothermal coils).

Figure 8A:
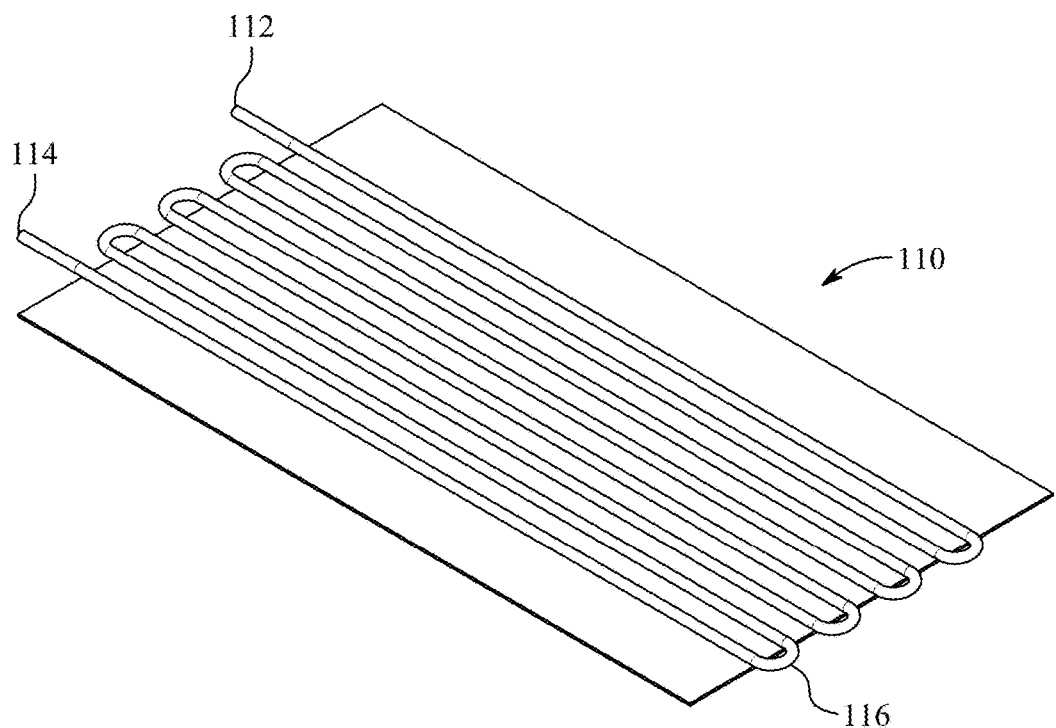
FIG. 8A is a perspective view illustration of a heat exchange plate including serpentine coolant coils therein, according to certain embodiments.
Figure 8B:
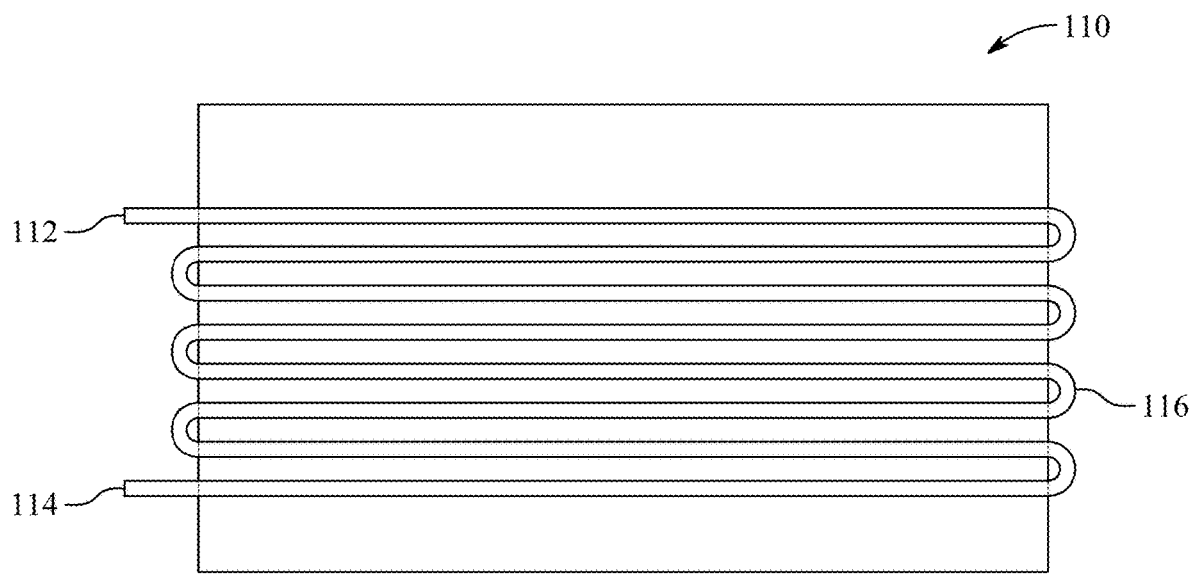
FIG. 8B is a top planar view illustration of the heat exchange plate shown in FIG. 8A, according to certain embodiments.

FIG. 8A provides a perspective view illustration and FIG. 8B provides a top planar view illustration of the exemplary heat exchange plate 110. The heat exchange plate 110 shown is representative of each of the plurality of heat exchange plates 110 installed within the electric vehicle charger 106. The primary function of the heat exchange plate 110 is to establish an efficient thermal pathway from the plurality of electronic charging components 108 to the circulating the coolant. Each heat exchange plate 110 comprises a cooling plate, embodied as the plate body thereof, which forms the main structure. The plurality of heat exchange plates 110 (functioning as a plurality of cooling plates) are configured to cover the plurality of electronic charging components 108 within each charging pod 104, to provide thermal management of the heat-generating devices.

Each cooling plate (the plate body of the heat exchange plate 110) is made of a material which has a high thermal conductivity. The selection of a high thermal conductivity material minimizes the thermal resistance between the electronic charging components 108 and the internal coolant passages, facilitating rapid heat transfer. In a non-limiting example, the material for the plate body of the heat exchange plate 110 is selected from the group consisting of copper, aluminum nitride, aluminum, zinc coated steel, and zinc coated iron. These materials offer favorable thermal properties suitable for heat sink applications. For dimensional context, each cooling plate (each heat exchange plate 110) is approximately 400 mm in height and approximately 600 mm in width, providing a substantial surface area for both interfacing with the electronic charging components 108 and incorporating the coolant passages.

Each cooling plate (each heat exchange plate 110) includes the serpentine coolant coil 116 integrated therein or thereon. The serpentine coolant coil 116 defines the pathway through which the coolant flows to absorb heat from the plate body of the heat exchange plate 110. As illustrated, the serpentine coolant coil 116 follows a winding path across the area of the plate body to maximize contact time and heat exchange surface area. The serpentine coolant coil 116 is made of high-density polyethylene (HDPE). HDPE provides the required chemical compatibility with the coolant, sufficient durability, and ease of forming into the required serpentine shape.

The configuration of the serpentine coolant coil 116 within the plate body creates multiple flow segments across the width or height of the plate. Functionally, the serpentine coolant coil 116 has at least four parallel loops and less than twenty parallel loops. These parallel loops are formed by the successive passes of the coil tubing across the heat exchange plate 110, distributing the coolant flow over the heat transfer area. This parallel loop structure within the overall serpentine path aids in achieving uniform temperature distribution across the plate body and manages the pressure drop of the coolant flowing through the heat exchange plate 110. The coolant enters through the coolant inlet 112 connected to the inlet end of the serpentine coolant coil 116 and exits through the coolant outlet 114 connected to the outlet end of the serpentine coolant coil 116. Each charging pod 104 may contain multiple heat exchange plates 110 as needed to cover the electronic components.

Figure 9A:
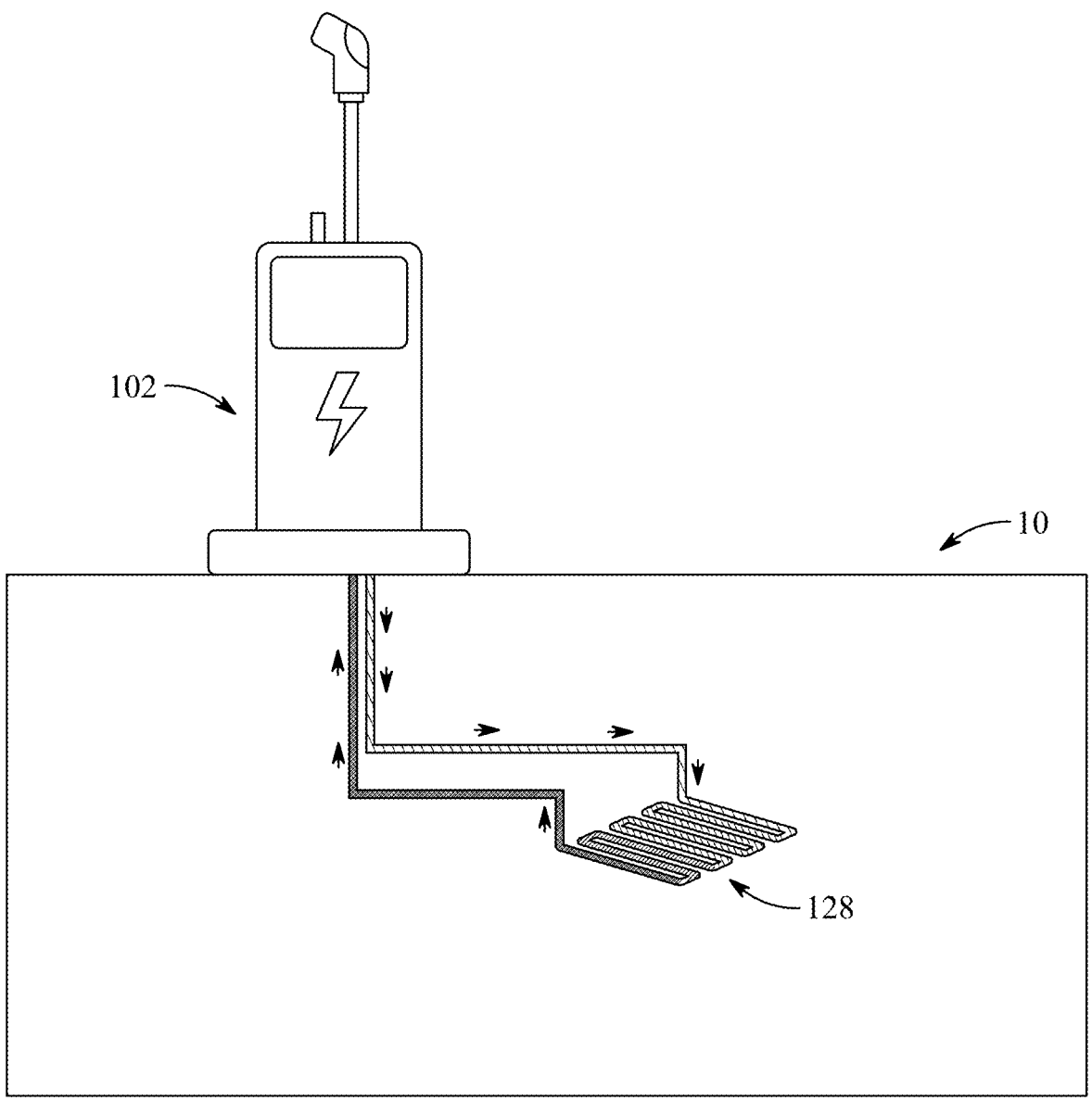
FIG. 9A is an illustration of a geothermal coil configuration utilizing a horizontal ground loop collector, according to certain embodiments.

FIG. 9A illustrates one exemplary configuration for the plurality of geothermal coils 128, specifically utilizing a horizontal ground loop collector arrangement. In this configuration, lengths of pipe comprising the plurality of geothermal coils 128 are installed horizontally within trenches excavated at the required below ground depth, typically in the range of about 15 m to 20 m. The pipes are laid out, often in parallel runs, covering a specific ground surface area to achieve the necessary total length for effective heat exchange with the surrounding earth mass. This configuration is generally suitable for sites where sufficient land area is available for excavation.

Figure 9B:
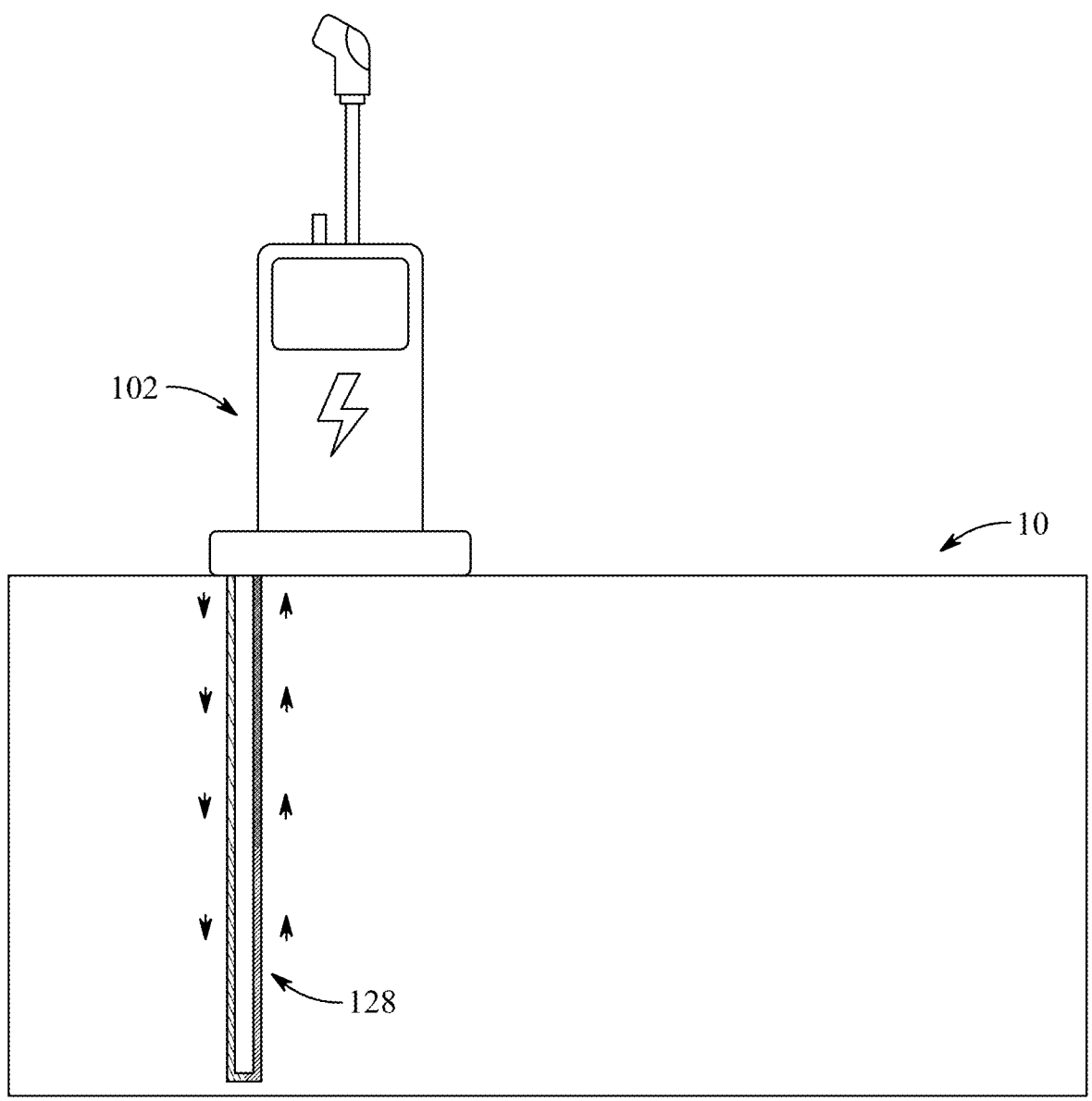
FIG. 9B is an illustration of a geothermal coil configuration utilizing a vertical ground loop collector, according to certain embodiments.

FIG. 9B illustrates an alternative exemplary configuration for the plurality of geothermal coils 128, utilizing a vertical ground loop collector arrangement. This configuration involves drilling one or more deep vertical boreholes into the ground, extending to or beyond the target depth range of about 15 m to 20 m. A U-shaped loop of pipe, forming part of the plurality of geothermal coils 128, is inserted into each borehole. The boreholes are typically backfilled with a thermally conductive material to enhance heat transfer between the pipes of the plurality of geothermal coils 128 and the surrounding earth. The vertical configuration requires significantly less surface land area compared to the horizontal arrangement shown in FIG. 9A, making the vertical configuration suitable for installations with space constraints.

Figure 9C:
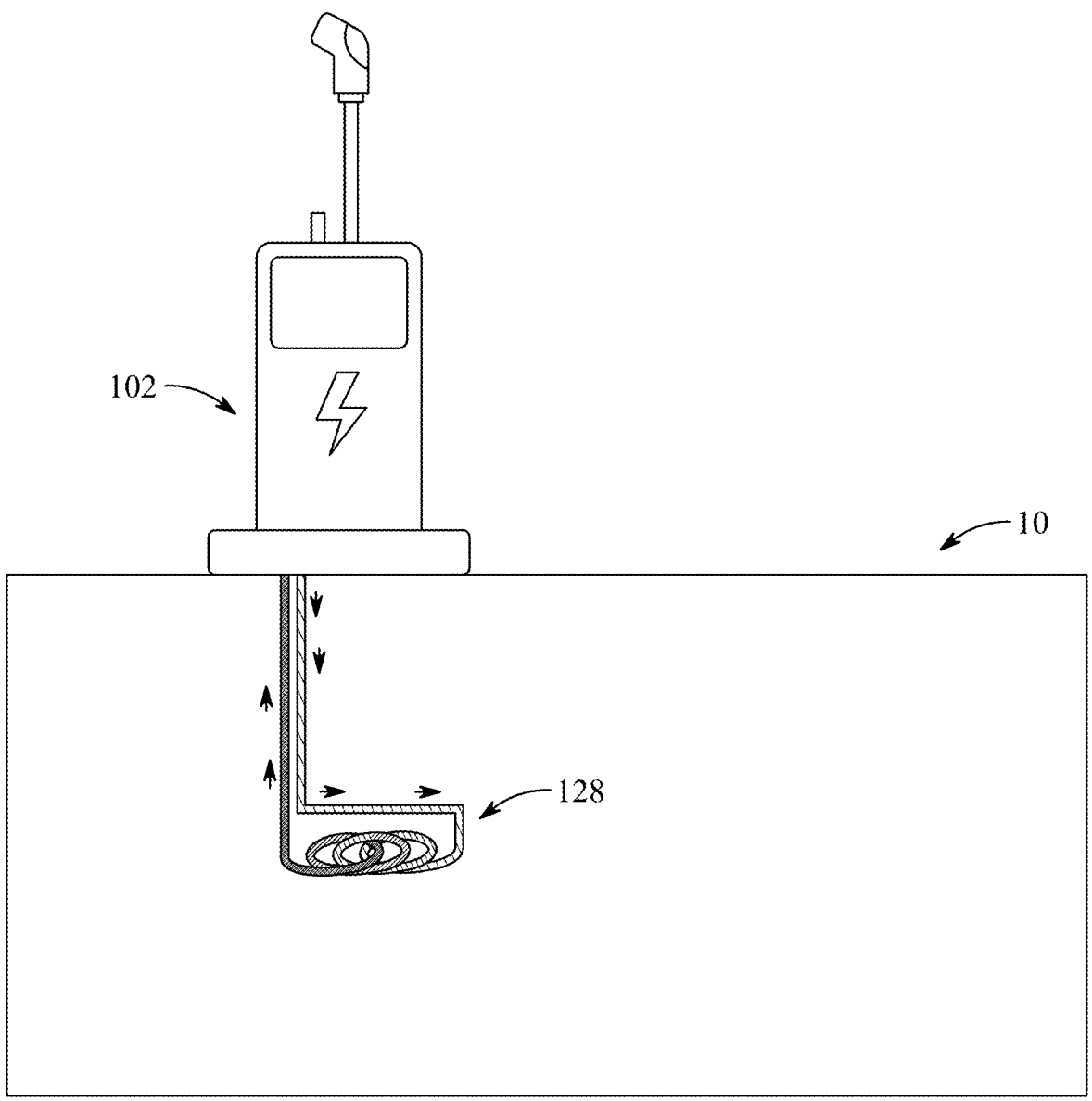
FIG. 9C is an illustration of a geothermal coil configuration utilizing a looped horizontal collector, according to certain embodiments.

FIG. 9C illustrates another exemplary configuration for the plurality of geothermal coils 128, utilizing a looped horizontal collector, sometimes referred to as a slinky loop configuration. Similar to the arrangement in FIG. 9A, this configuration involves installing the pipes of the plurality of geothermal coils 128 in horizontal trenches at the required depth. However, instead of straight runs, the pipe is arranged in overlapping coils or loops within the trench. This looped arrangement allows a greater total length of the pipe comprising the plurality of geothermal coils 128 to be installed per unit length of trench, thereby increasing the heat transfer surface area within a more limited excavation footprint compared to the simple horizontal layout.

Figure 9D:
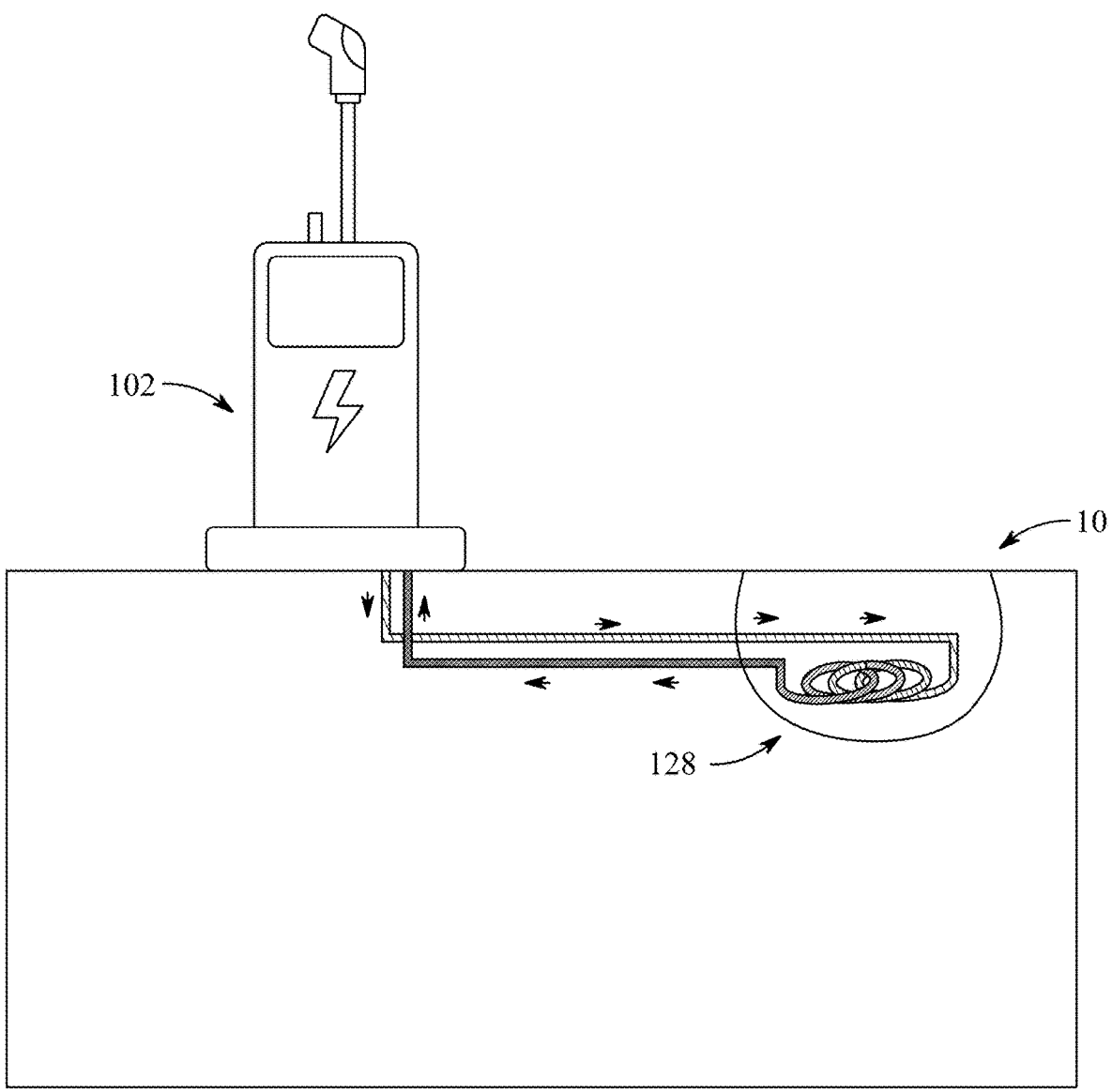
FIG. 9D is an illustration of a geothermal coil configuration utilizing a pond loop collector, according to certain embodiments.

FIG. 9D illustrates yet another exemplary configuration for the plurality of geothermal coils 128 utilizing a pond loop collector. This configuration is applicable only when the charging station 100 is situated adjacent to an adequate body of surface water, such as a lake or pond. In this arrangement, coils or mats of the pipe comprising the plurality of geothermal coils 128 are submerged within the body of water, typically anchored near the bottom. The surrounding water serves as the medium for heat exchange, absorbing heat from the coolant (in cooling mode) or providing heat to the coolant (in warming mode). Water generally provides efficient heat transfer, making this a viable option where site conditions permit.

Each of the five configurations of the geothermal coils represents a distinct embodiment of the geothermal cooling pipe system, each of which are optimized for varying installation conditions and thermal performance requirements. The pipes are typically made of thermally conductive, corrosion-resistant materials such as HDPE or copper-lined composites.

The diameter of the pipes ranges from 25 mm to 50 mm, depending on the thermal load. The depth of burial varies between 10-20 meters to ensure stable geothermal temperature exposure.

Horizontal and vertical coil systems may include 3 to 6 loops per unit, with a total pipe length per station between 60-120 meters. Spiral and U-loop configurations are used where space or soil conditions dictate.

Each configuration is designed to maximize surface area contact with the earth to enhance heat exchange efficiency while minimizing flow resistance in the coolant system.

Figure 10A:
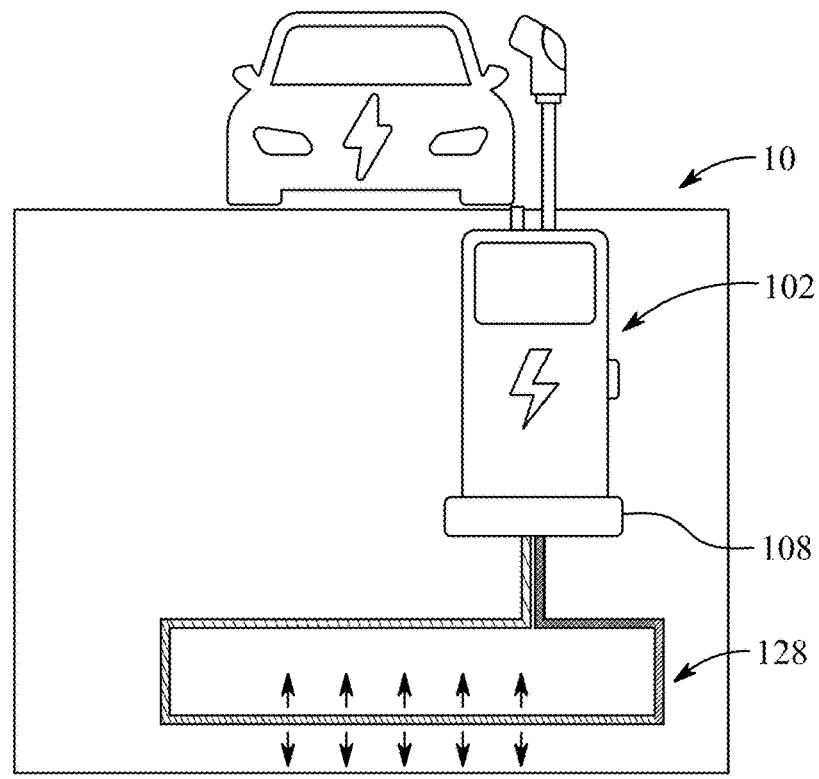
FIG. 10A is a simplified schematic illustration of a charging station depicting heat flow for cooling in an underground system configuration, according to certain embodiments.

FIG. 10A is a simplified schematic illustration depicting the principle of heat flow within the charging station 100 configured for cooling, consistent with the underground system configuration described herein. Herein, heat originating from the plurality of electronic charging components 108 located within the below-ground charging pod 104, is transferred via circulating the coolant through a plurality of heat exchange means to the plurality of geothermal coils 128. The heat flow represents the transfer of this thermal energy from the coolant within the plurality of geothermal coils 128 to the surrounding deep earth mass, which serves as a stable, low-temperature heat sink. This configuration leverages the favorable temperature difference between the heated coolant and the deep earth for efficient heat rejection.

Figure 10B:
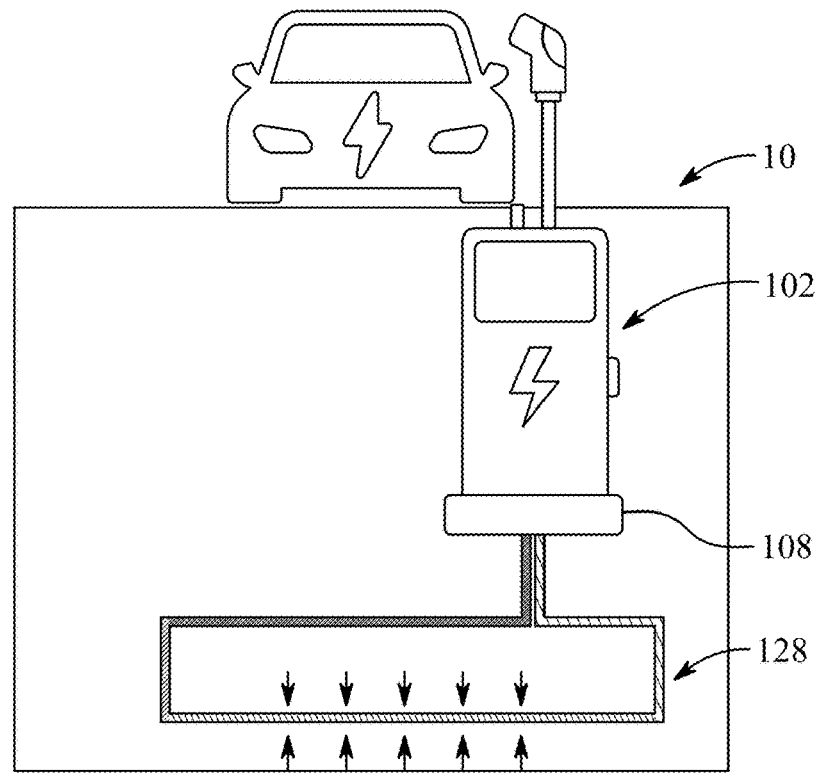
FIG. 10B is a simplified schematic illustration of a charging station depicting heat flow for heating in an underground system configuration, according to certain embodiments.

FIG. 10B is a simplified schematic illustration depicting the principle of heat flow within the charging station 100 configured for heating, again consistent with the underground system configuration. In this operational mode, applicable during low ambient temperature conditions, the deep earth mass serves as a heat source due to the temperature thereof being higher than the temperature of the plurality of electronic charging components 108. Heat flow represents the transfer of thermal energy from the deep earth to the coolant circulating within the plurality of geothermal coils 128. This absorbed heat is then transported by the coolant back to the plurality of heat exchange means, where the heat is released to warm the plurality of electronic charging components 108, maintaining the electronic charging components 108 within the desired operating temperature range.

Figure 11A:
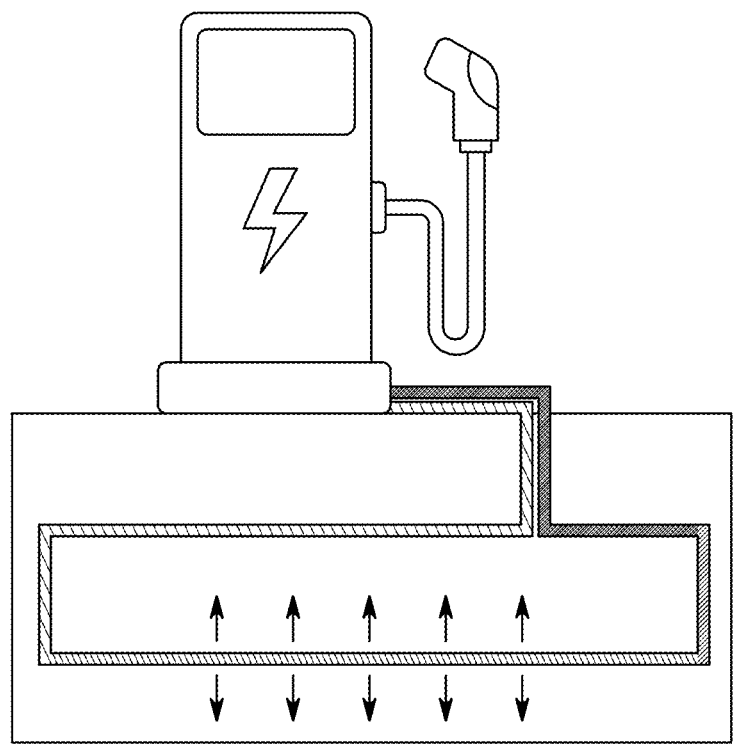
FIG. 11A is a simplified schematic illustration of a charging station depicting heat flow for cooling in an aboveground system.

FIG. 11A is a simplified schematic illustration depicting heat flow for cooling in an above-ground system arrangement, for comparative purposes. In such a configuration, heat generated by a source (such as electronics) would typically be rejected directly to the ambient air surrounding the equipment, often using air-cooled heat sinks or liquid-to-air radiators. The efficiency of this heat rejection is directly dependent on the temperature of the ambient air; high air temperatures reduce the effectiveness and may necessitate more energy-intensive cooling methods.

Figure 11B:
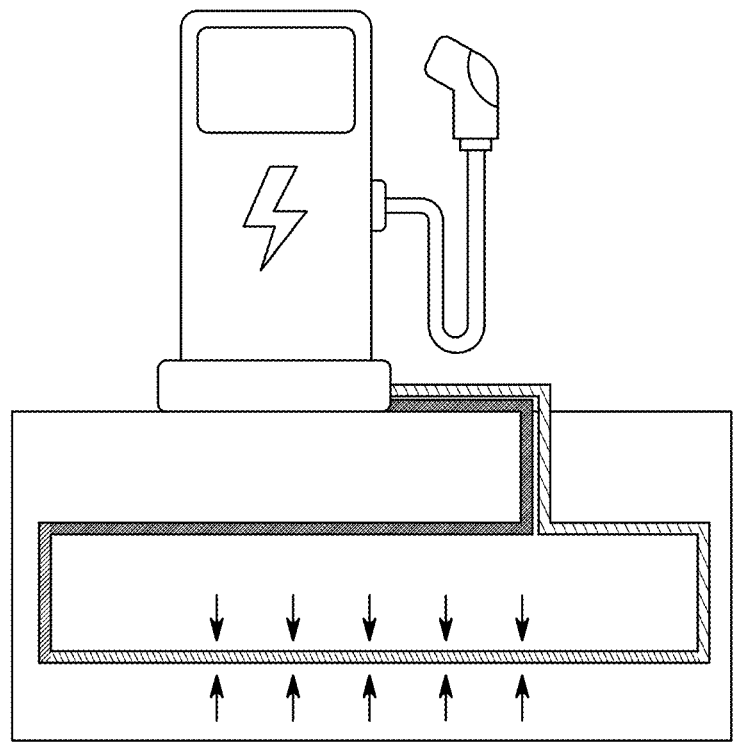
FIG. 11B is a simplified schematic illustration of a charging station depicting heat flow for heating in an aboveground system.

FIG. 11B is a simplified schematic illustration depicting heat flow for heating in an above-ground system arrangement. Attempting to heat a source by drawing heat from the ambient air using, for example, an air-source heat pump cycle, becomes increasingly inefficient and challenging as the temperature of the ambient air decreases significantly below the target temperature of the source. The above-ground configurations illustrated in FIGS. 11A and 11B highlight the thermal management challenges associated with surface-level installations in varying ambient conditions, which the underground geothermal approach of the present disclosure is designed to mitigate, without departing from the spirit and scope of the present disclosure should certain components be adapted for above-ground use where geothermal coupling is not feasible or desired.

Figure 12:
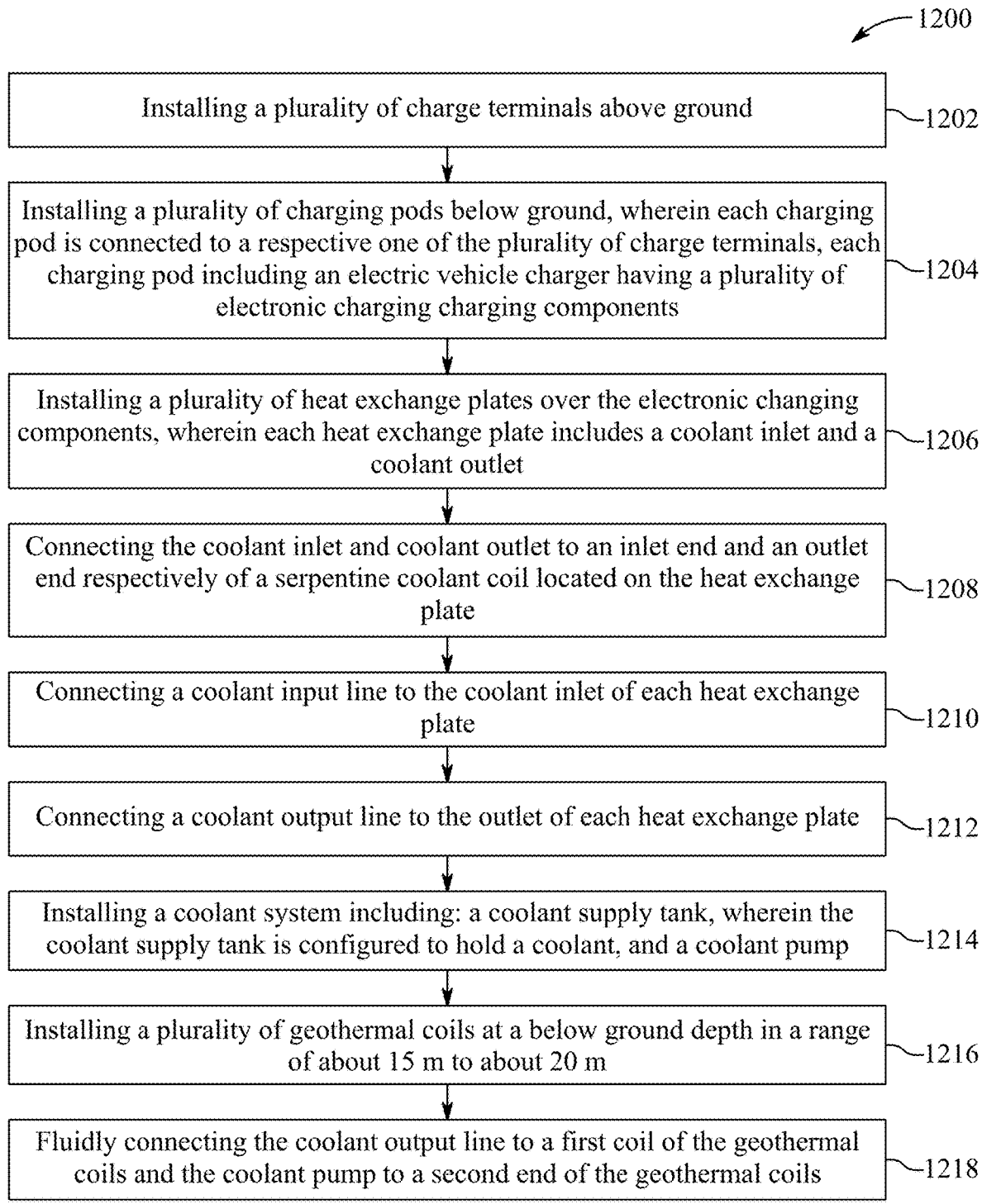
FIG. 12 is a flowchart illustrating steps involved in a method for regulating a temperature of each of a charging pod of a charging station for electric vehicles, according to certain embodiments.

Referring to FIG. 12, illustrated is a flowchart listing steps involved in a method 1200 for regulating a temperature of each charging pod 104 of the charging station 100 for electric vehicles, encompassing the installation and interconnection of the system components. The method 1200 provides a sequence for constructing the geothermally cooled charging infrastructure described herein. The method 1200 includes a series of steps. These steps are only illustrative, and other alternatives may be considered where one or more steps are added, one or more steps are removed, or one or more steps are provided in a different sequence without departing from the scope of the present disclosure. Various variants described above, with respect to the aforementioned charging station 100 apply mutatis mutandis to the present method 1200.

At step 1202, the method 1200 includes installing the plurality of charge terminals 102 above the ground 10. This step involves the physical placement and securing of the charge terminals 102 at predetermined locations accessible to electric vehicles. The installation includes preparing foundations and routing necessary conduits for electrical power and communication wiring that will connect to the underground components of the charging station 100.

At step 1204, the method 1200 includes installing the plurality of charging pods 104 below the ground 10, wherein each charging pod 104 is connected to a respective one of the plurality of charge terminals 102, each charging pod 104 including the electric vehicle charger 106 having the plurality of electronic charging components 108. This step requires excavation to the specified depth (e.g., approximately 1 to 3 meters) and placement of the charging pods 104, within the underground enclosures 148. The connection between each charging pod 104 and the respective the charge terminal 102 is established via the electric cable 155 during this phase, and the electric vehicle charger 106 containing the electronic charging components 108 is secured within each charging pod 104.

At step 1206, the method 1200 includes installing the plurality of heat exchange plates 110 over the electronic charging components 108, wherein each heat exchange plate 110 includes the coolant inlet 112 and the coolant outlet 114. This involves physically mounting the heat exchange plates 110 inside each electric vehicle charger 106, ensuring close thermal contact with the surfaces of the electronic charging components 108 designated for cooling. Proper mounting techniques and potentially the application of thermal interface materials are employed to minimize thermal resistance.

At step 1208, the method 1200 includes connecting the coolant inlet 112 and the coolant outlet 114 to an inlet end and an outlet end respectively of the serpentine coolant coil 116 located on the heat exchange plate 110. This step establishes the fluid pathway within each heat exchange plate 110 by making secure connections between the external ports (the coolant inlet 112, the coolant outlet 114) and the corresponding start and end points of the serpentine coolant coil 116 embedded within or attached to the plate body.

At step 1210, the method 1200 includes connecting the coolant input line 118 to the coolant inlet 112 of each heat exchange plate 110. This involves routing the designated piping for the coolant input line 118 from the output of the coolant pump 126 (or distribution point) and making a fluid-tight connection to the coolant inlet 112 on each installed heat exchange plate 110.

At step 1212, the method 1200 includes connecting the coolant output line 120 to the coolant outlet 114 of each heat exchange plate 110. This step requires routing the piping for the coolant output line 120 from the coolant outlet 114 of each heat exchange plate 110 towards the inlet of the plurality of geothermal coils 128 (or collection point) and securing these fluid connections.

At step 1214, the method 1200 includes installing the cooling system 122 including: the coolant supply tank 124, wherein the coolant supply tank 124 is configured to hold the coolant, and the coolant pump 126. This involves the physical placement and securing of the coolant supply tank 124 and the coolant pump 126, along with associated components like the reversible motor 130, the variable flow device 132, and the ultrasonic flow meter 134, either within each charging pod 104 or in a separate underground location as per the selected configuration.

At step 1216, the method 1200 includes installing the plurality of geothermal coils 128 at the below ground depth in the range of about 15 m to about 20 m. This installation step involves employing ground excavation or drilling techniques suitable for the chosen coil configuration (e.g., horizontal, vertical, or pond) to place the required length of the heat exchange pipe at the specified deep subterranean level where stable earth temperatures prevail.

At step 1218, the method 1200 includes fluidly connecting the coolant output line 120 to a first coil end of the plurality of geothermal coils 128 and fluidly connecting the coolant pump 126 to a second coil end of the plurality of geothermal coils 128. This completes the overall fluid circuit by linking the heat absorption side (the heat exchange plates 110) via the coolant output line 120 to the inlet of the ground heat exchanger (the plurality of geothermal coils 128), and linking the outlet of the ground heat exchanger back to the suction side of the coolant pump 126, typically via the coolant supply tank 124. This establishes the path for continuous coolant circulation through the entire thermal management system.

The method 1200 further includes connecting the reversible motor 130 to the coolant pump 126, establishing the mechanical drive for coolant circulation. The method 1200 includes connecting the variable flow device 132 to the coolant pump input pipe, enabling regulation of the coolant flow rate entering the coolant pump 126. The method 1200 includes connecting the ultrasonic flow meter 134 to the coolant pump output pipe, positioning the ultrasonic flow meter 134 to monitor the coolant flow after the coolant exits the coolant pump 126; the ultrasonic flow meter 134 is configured for generating the pressure measurement signals related to the coolant flow within the coolant pump output pipe. The method 1200 also includes connecting the power supply 136 through the relay 138 to the reversible motor 130, providing the switched electrical power path for operating the reversible motor 130. Furthermore, the method 1200 involves installing the plurality of temperature sensors 140, including installing the temperature sensor 140 within each charging pod 104 (such as the heat exchange plate temperature sensor), installing the temperature sensor 140 on each coolant output line 120 (such as the coolant outlet temperature sensor), and installing the temperature sensor 140 on each charge terminal 102 (for measuring ambient or terminal conditions). Each temperature sensor 140 is configured for performing the temperature measurements at the respective location thereof and generating the corresponding the temperature measurement signals. The method 1200 further includes installing the computing device 142 within each charging pod 104.

The method 1200 further includes operatively connecting each computing device 142 to the reversible motor 130, the variable flow device 132, the ultrasonic flow meter 134, and the power supply 136 associated with each charging pod 104 (or shared system). This establishes the necessary control and communication links. The computing device 142 includes the electrical circuitry, the memory configured to store the program instructions, and the at least one processor configured for executing the program instructions. The execution of the program instructions configures the computing device 142 for: receiving power from the power supply 136; receiving the temperature measurement signals from the plurality of temperature sensors 140; receiving the pressure measurement signals from the ultrasonic flow meter 134; and receiving the flow measurement signals or feedback from the variable flow device 132. The program instructions further configure the computing device 142 for comparing the received temperature measurement signals to the temperature threshold (both the upper threshold for cooling and the lower threshold for heating). Based on these comparisons, the computing device 142 is configured for actuating the reversible motor 130 to cause the coolant pump 126 to pump the coolant to the coolant inlet 112 to lower the temperature of the heat exchange plates 110 when the temperature measurement signals exceed the upper temperature threshold. Additionally, the computing device 142 is configured for actuating the reversible motor 130 to circulate the coolant in a manner that draws heat from the plurality of geothermal coils 128 (effectively drawing coolant from the coolant inlet 112 in the context of the reversed warming cycle described in FIG. 3) to raise the temperature of the heat exchange plates 110 when the temperature measurement signals are less than the lower temperature threshold.

In some examples, the data collected by the computing device 142 from the plurality of temperature sensors 140, the pressure measurement signals from the ultrasonic flow meter 134, and operational feedback from the variable flow device 132 (which may include parameters indicative of the load on the reversible motor 130, such as current or power consumption) can be utilized for implementing predictive maintenance routines. The computing device 142, either locally or by transmitting the data via a network controller to a remote server or cloud platform, can analyze trends in these parameters over time. Algorithms executed by the computing device 142 or the remote server can identify patterns indicative of potential component degradation or impending failure (e.g., rising motor current for a given flow rate, increasing temperature differentials, abnormal pressure fluctuations), allowing for proactive maintenance scheduling before a critical failure occurs, thereby enhancing the reliability and uptime of the charging station 100.

The charging station 100 of the present disclosure utilizes a configuration in which the plurality of charging pods 104 containing the electric vehicle charger 106 and the plurality of electronic charging components 108 are located below the ground 10. Thermal management is achieved through the plurality of heat exchange plates 110 positioned over the electronic charging components 108, which transfer heat to the coolant circulated by the coolant pump 126 of the cooling system 122. The heat absorbed by the coolant is subsequently transferred to the surrounding earth via the plurality of geothermal coils 128 buried at a below ground depth in the range of about 15 m to about 20 m, accessing a stable thermal reservoir. The operation is regulated by the computing device 142 utilizing input from the plurality of temperature sensors 140, the ultrasonic flow meter 134, and the variable flow device 132 to control the reversible motor 130 driving the coolant pump 126.

In the present charging system 100, locating the plurality of charging pods 104 below the ground 10 inherently shields the electric vehicle charger 106 and the plurality of electronic charging components 108 from direct solar radiation, high ambient air temperatures, precipitation, dust, low ambient air temperatures, snow, sleet, high winds and other surface environmental factors that can impede performance or accelerate degradation in above-ground installations. The use of the plurality of geothermal coils 128 buried at the specified depth allows for heat rejection to a medium with a relatively constant and lower temperature compared to ambient air, particularly during periods of high surface heat. This configuration potentially reduces the energy expenditure required for cooling/heating compared to systems relying on air conditioning or high-volume air circulation, especially under demanding thermal loads.

Furthermore, the alternative embodiments (as described in FIG. 5, FIG. 6 and FIG. 7) illustrate the modularity and scalability of the design, allowing configurations with shared cooling system components or shared geothermal coils to accommodate installations with varying numbers of charging pods 104.

Further, in the present charging system 100, the computing device 142 enables adaptive thermal regulation based on real-time conditions measured by the plurality of temperature sensors 140 and the ultrasonic flow meter 134. The inclusion of the reversible motor 130 allows the system to provide cooling by rejecting heat to the plurality of geothermal coils 128 as well as provide heating by extracting heat from the plurality of geothermal coils 128 when the temperature measurement signals indicate conditions below the lower temperature threshold. The variable flow device 132, adjusted based on the temperature measurement signals and the pressure measurement signals, allows for modulation of the coolant flow rate, further optimizing thermal performance and energy use across different operational states and environmental conditions.

A first embodiment describes a charging station 100 for electric vehicles, comprising a plurality of charge terminals 102 located above ground and a plurality of charging pods 104 located below ground. Each charging pod 104 is connected to one of the plurality of charge terminals 102. Each charging pod 104 includes an electric vehicle charger 106 including a plurality of electronic charging components 108. Each charging pod 104 further includes a plurality of heat exchange plates 110 located in the electric vehicle charger 106 over the electronic charging components 108. Each heat exchange plate 110 includes a coolant inlet 112 and a coolant outlet 114, where the coolant inlet 112 and coolant outlet 114 are connected to an inlet end and an outlet end respectively of a serpentine coolant coil 116 located on the heat exchange plate 110. Each charging pod 104 also includes a coolant input line 118 connected to the coolant inlet 112 of each heat exchange plate 110 and a coolant output line 120 connected to the coolant outlet 114 of each heat exchange plate 110. The charging station 100 includes a cooling system 122 including a coolant supply tank 124 configured to hold a coolant, and a coolant pump 126. The charging station 100 further comprises a plurality of geothermal coils 128 fluidly connected between the coolant output line 120 and the coolant pump 126, wherein the plurality of geothermal coils 128 are buried at a below ground depth in a range of about 15 m to about 20 m.

In an aspect, the charging station 100 further comprises a reversible motor 130 connected to the coolant pump 126, and a variable flow device 132 connected to a coolant pump input pipe. The charging station 100 includes an ultrasonic flow meter 134 connected to a coolant pump output pipe, wherein the ultrasonic flow meter 134 is configured to generate pressure measurement signals of a coolant flow in the coolant pump output pipe. The charging station 100 also includes a power supply 136 connected through a relay 138 to the reversible motor 130, and a plurality of temperature sensors 140, wherein each temperature sensor 140 is configured to perform temperature measurements and generate temperature measurement signals. Furthermore, the charging station 100 includes a computing device 142 located within each charging pod 104. The computing device 142 is operatively connected to the reversible motor 130, the variable flow device 132, the ultrasonic flow meter 134 and the power supply 136. The computing device 142 includes an electrical circuitry, a memory configured to store program instructions and at least one processor configured to execute the program instructions. The computing device 142 is configured to receive power from the power supply 136, receive the temperature measurement signals from the plurality of temperature sensors 140, receive pressure measurement signals from the ultrasonic flow meter 134, receive flow measurement signals from the variable flow device 132, compare the temperature measurement signals to a temperature threshold, and actuate the reversible motor 130 to pump coolant to the coolant inlet 112 to lower the temperature of the heat exchange plates 110 when the temperature measurement signals exceed the temperature threshold.

In an aspect, the charging station 100 further comprises the plurality of temperature sensors 140 comprising a heat exchange plate temperature sensor 140 located within each charging pod 104, a coolant outlet temperature sensor 140 located at each coolant outlet 114, and a coolant tank temperature sensor 140 located in each coolant supply tank 124.

In an aspect, the charging station 100 further comprises an underground enclosure 148 configured to surround the electric vehicle charger 106, the coolant supply tank 124, the coolant pump 126, the reversible motor 130, the variable flow device 132 and the ultrasonic flow meter 134. The underground enclosure 148 is located at a depth of about one meter to three meters below ground. The underground enclosure 148 is constructed from reinforced concrete 144.

In an aspect, the computing device 142 of the charging station 100 is further configured to subtract an amplitude of the pressure measurement signals from a pressure setpoint, generate an error correction signal, and transmit the error correction signal to the variable flow device 132. The variable flow device 132 is configured to adjust a pressure of a flow of coolant to the coolant pump 126 when a magnitude of the error correction signal is not equal to the pressure setpoint.

In an aspect, a first end of the geothermal coils 128 is connected to the coolant output line 120 and a second end of the geothermal coils 128 is connected to the coolant pump 126.

In an aspect, the charging station 100 further comprises the reversible motor 130 connected to the coolant pump 126, and the variable flow device 132 connected to the coolant pump input pipe. The charging station 100 includes the ultrasonic flow meter 134 connected to the coolant pump output pipe, configured to generate pressure measurement signals of a coolant flow in the coolant pump output pipe. The charging station 100 also includes the power supply 136 connected through the relay 138 to the reversible motor 130, and the plurality of temperature sensors 140 configured to perform temperature measurements and generate temperature measurement signals. Furthermore, the charging station 100 includes the computing device 142 located within each charging pod 104, operatively connected to the reversible motor 130, the variable flow device 132, the ultrasonic flow meter 134 and the power supply 136. The computing device 142 includes the electrical circuitry, the memory, and the at least one processor. The computing device 142 is configured to receive power from the power supply 136, receive the temperature measurement signals from the plurality of temperature sensors 140, receive pressure measurement signals from the ultrasonic flow meter 134, receive flow measurement signals from the variable flow device 132, compare the temperature measurement signals to a temperature threshold, and actuate the reversible motor 130 to pump coolant to the plurality of geothermal coils 128 to raise the temperature of the heat exchange plates 110 when the temperature measurement signals are less than the temperature threshold.

In an aspect, the charging station 100 further comprises a charging cable 150 having a first end connected to the electronic charging components 108 of the electric vehicle charger 106, wherein a second end of the charging cable 150 is connected to the charge terminal 102. The charging station 100 also includes a charge plug 152 located on the charge terminal 102, wherein the charge plug 152 is configured to connect to a charge socket of an electric vehicle.

In an aspect, each charge plug 152 is configured to deliver a DC fast charge to the charge socket of the electric vehicle.

In an aspect, the plurality of charging pods 104 are located below ground at a depth in a range of about one meter to about three meters.

In an aspect, the coolant is water.

In an aspect, the coolant is a non-toxic, environmentally friendly coolant selected from the group consisting of water, ammonia and propylene glycol.

In an aspect, the serpentine cooling coil 116, the coolant input line 118, the coolant output line 120 and the geothermal coils 128 are made from high-density polyethylene (HDPE).

In an aspect, the coolant input line 118, the coolant output line 120 and the geothermal coils 128 are double walled pipes.

In an aspect, each charging pod 104 includes the electric vehicle charger 106 and the cooling system 122 in a single unit, wherein the single unit is surrounded by a reinforced concrete enclosure.

In an aspect, the charging station 100 further comprises a plurality of access shafts 154, wherein each access shaft 154 is configured to connect between the surface of the ground and a respective single unit, wherein each access shaft 154 is encased in reinforced concrete 144.

In an aspect, the charging station 100 further comprises a plurality of access shafts 154, wherein each access shaft 154 is configured to connect between the surface of the ground and a respective charging pod 104, wherein each access shaft 154 is encased in reinforced concrete 144.

Each charging pod includes a dedicated vertical access shaft, typically integrated adjacent to or directly above the charging unit, depending on the layout. The shaft diameter ranges from 0.6 to 1 meters, allowing sufficient clearance for maintenance tools and personnel, and is equipped with a sealed, insulated access cover at ground level.

Furthermore, each pod includes a service access plate or hatch. This is typically located on the top horizontal surface of the pod, accessible via the shaft or surface entry point. In some configurations, the access door may also be mounted laterally for embedded side-facing pods.

In an aspect, each heat exchange plate 110 comprises a plurality of cooling plates, wherein each cooling plate is made of a material which has a high thermal conductivity. The material is any one of copper, aluminum nitride, aluminum, zinc coated steel and zinc coated iron. Each cooling plate includes the serpentine coolant coil 116. The serpentine coolant coil 116 is made of high-density polyethylene. The serpentine coolant coil 116 has at least four parallel loops and less than twenty parallel loops. The plurality of cooling plates are configured to cover the plurality of electronic components 108 of each charging pod 104, wherein each cooling plate is about 400 mm in height and about 600 mm in width.

A second embodiment describes a method 1200 for regulating a temperature of a charging pod 104 of a charging station 100 for electric vehicles, comprising installing 1202 a plurality of charge terminals 102 above ground. The method 1200 comprises installing a plurality of charging pods 104 below ground, wherein each charging pod 104 is connected to a respective one of the plurality of charge terminals 102, each charging pod 104 including an electric vehicle charger 106 having a plurality of electronic charging components 108. The method 1200 further comprises installing a plurality of heat exchange plates 110 over the electronic charging components 108, wherein each heat exchange plate 110 includes a coolant inlet 112 and a coolant outlet 114. The method 1200 further comprises connecting the coolant inlet 112 and the coolant outlet 114 to an inlet end and an outlet end respectively of a serpentine coolant coil 116 located on the heat exchange plate 110. The method 1200 further comprises connecting a coolant input line 118 to the coolant inlet 112 of each heat exchange plate 110 and connecting a coolant output line 120 to the coolant outlet 114 of each heat exchange plate 110. The method 1200 further comprises installing a cooling system 122 including a coolant supply tank 124 configured to hold a coolant, and a coolant pump 126. The method 1200 further comprises installing a plurality of geothermal coils 128 at a below ground depth in a range of about 15 m to about 20 m. The method 1200 further comprises fluidly connecting the coolant output line 120 to a first coil end of the plurality of geothermal coils 128 and fluidly connecting the coolant pump 126 to a second coil end of the plurality of geothermal coils 128.

In an aspect, the method 1200 further comprises connecting a reversible motor 130 to the coolant pump 126, connecting a variable flow device 132 to a coolant pump input pipe, and connecting an ultrasonic flow meter 134 to a coolant pump output pipe. The method 1200 further comprises generating, by the ultrasonic flow meter 134, pressure measurement signals of a coolant flow in the coolant pump output pipe. The method 1200 further comprises connecting a power supply 136 through a relay 138 to the reversible motor 130. The method 1200 further comprises installing a temperature sensor 140 of the plurality of temperature sensors 140 in each charging pod 104, on each coolant output line 120 and on each charge terminal 102. The method 1200 further comprises performing, by each temperature sensor 140, temperature measurements, and generating, by each temperature sensor 140, temperature measurement signals. The method 1200 further comprises installing a computing device 142 in each charging pod 104. The method 1200 further comprises operatively connecting each computing device 142 to the reversible motor 130, the variable flow device 132, the ultrasonic flow meter 134 and the power supply 136 of each charging pod 104. The computing device 142 includes an electrical circuitry, a memory configured to store program instructions and at least one processor configured for executing the program instructions for receiving power from the power supply 136, receiving the temperature measurement signals from the plurality of temperature sensors 140, receiving pressure measurement signals from the ultrasonic flow meter 134, receiving flow measurement signals from the variable flow device 132, comparing the temperature measurement signals to a temperature threshold, actuating the reversible motor 130 to pump coolant to the coolant inlet 112 to lower the temperature of the heat exchange plates 110 when the temperature measurement signals exceed the temperature threshold, and actuating the reversible motor 130 to pump coolant to the plurality of geothermal coils 128 to raise the temperature of the heat exchange plates 110 when the temperature measurement signals are less than the temperature threshold.

Each underground charging pod is equipped with an integrated sensor suite designed for real-time diagnostics and predictive maintenance. The types and placements of these sensors are as follows:

Temperature Sensors: Located at key heat transfer points within the cold plate, coolant inlet/outlet, and ambient underground zone to ensure thermal performance and detect overheating or thermal anomalies.

Pressure Sensors: Installed along the coolant pipes and reservoir to monitor system pressure and detect potential leaks, blockages, or pump failures.

Flow Sensors (Ultrasonic or Electromagnetic): Positioned within the main coolant circulation loop to verify flow rate consistency and detect abnormal flow behavior indicative of clogging or pump degradation.

Moisture/Leakage Sensors: Embedded around the pod casing and shaft interior to detect groundwater infiltration or internal leaks.

Electrical Load Sensors: Mounted on the power delivery unit to measure current draw and detect deviations suggesting charger hardware fatigue.

Predictive Maintenance System: Sensor data is continuously logged and processed by a local or cloud-based diagnostic processor, which employs threshold-based logic and AI-driven algorithms. These algorithms learn normal operating patterns over time and flag deviations that may indicate early-stage component wear, fluid loss, or environmental intrusion. This sensor data is used to generate maintenance alerts and service schedules based on actual performance trends, rather than fixed time intervals, significantly reducing unnecessary service costs while enhancing reliability.

The cooling pipes and subterranean pods can be installed using non-invasive trenchless construction techniques, which are especially beneficial in urban or environmentally sensitive areas. The key techniques are as follows:

Horizontal Directional Drilling (HDD): This method is used to install the cooling pipes horizontally beneath the surface without open excavation. A guided drill head bores a pilot hole at a precise depth (typically 10-20 meters), after which a reamer enlarges the hole to accommodate the pipe diameter. The cooling pipes are then pulled through the borehole, ensuring precise placement with minimal surface disruption.

Vertical Shaft Drilling or Microtunneling: For vertical pod installation, microtunneling or auger boring techniques may be used to drill down to the required depth (e.g., 3-5 meters for pod cavities, 15-20 meters for deep cooling pipes). The pod or cooling components are then lowered into place using crane-assisted insertion or guided descent rails.

Casing and Jacking Methods: In specific cases, pipe jacking with steel or polymer casings may be used to push pre-assembled components into place from a launch shaft, reducing soil displacement and avoiding trenching.

These methods are chosen based on soil conditions, depth requirements, and environmental constraints, enabling efficient underground infrastructure deployment with minimal surface footprint.

The system is designed to be modular and scalable, allowing multiple pods to be installed in linear or grid configurations based on site size, power availability, and cooling capacity.

However, the practical number of pods per station is determined by the following factors:

Access Shaft Distribution: Typically, one access shaft can service up to 4-6 pods arranged in proximity (e.g., radial or clustered layout). Additional pods beyond this count would require secondary shafts for compliance with maintenance and safety protocols.

Cooling System Capacity: The geothermal cooling loop is designed to be shared among multiple pods. A standard loop can support up to 6 pods, assuming standard energy loads. For higher demand, multiple parallel cooling circuits can be installed.

Remote Monitoring Limitations: The sensor network is managed via a local control unit that aggregates data from all pods. One controller can reliably handle telemetry from up to 10-12 pods depending on data transmission frequency. For larger installations, the system architecture allows for zonal segmentation, where each zone has its own local controller that communicates with a central server.

While there is no intrinsic design limit, the deployment is logically divided into manageable, monitored clusters to ensure system integrity, cooling efficiency, and maintainability.

Figure 13:
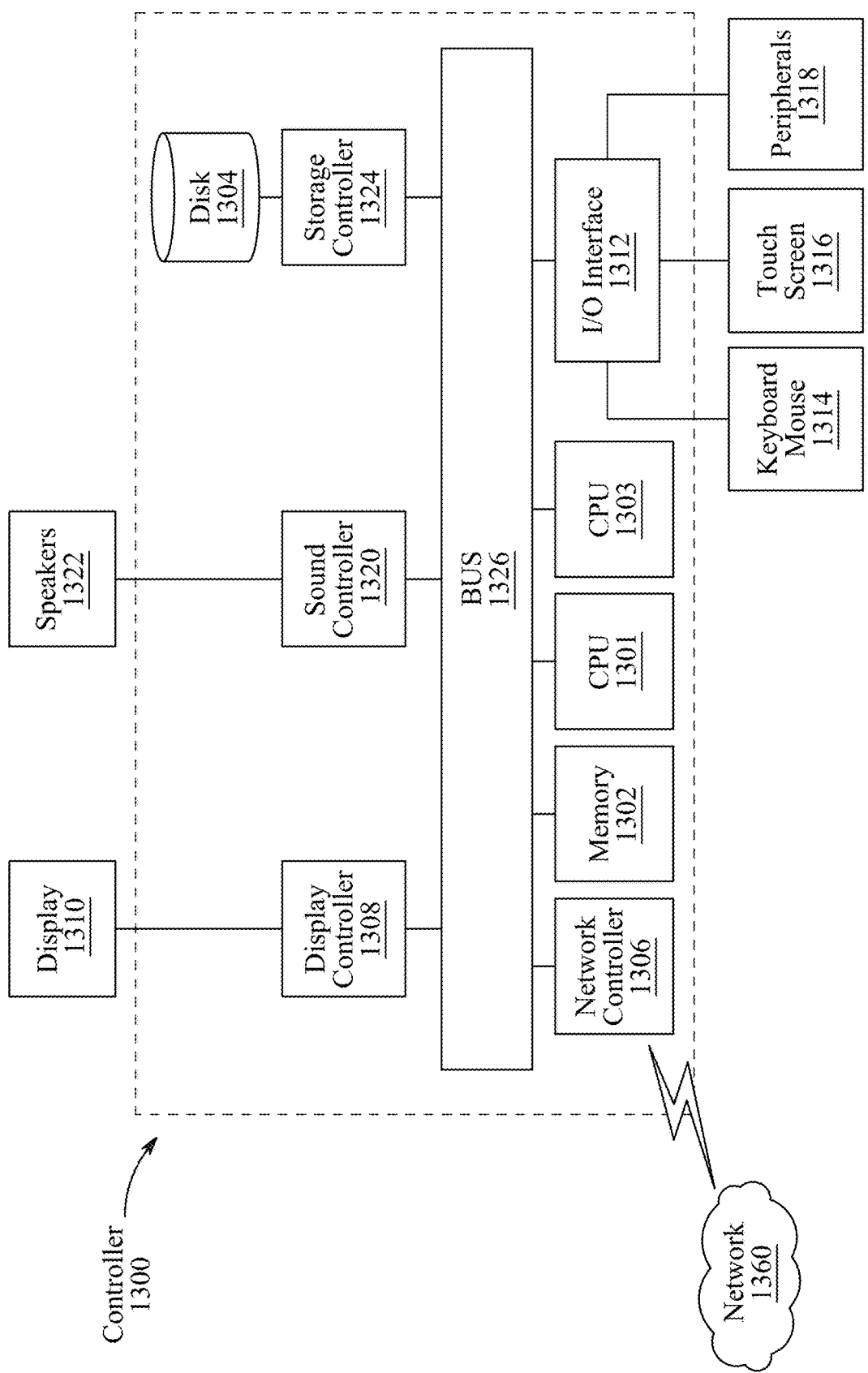
FIG. 13 is an illustration of a non-limiting example of details of computing hardware used in the computing system, according to certain embodiments.

Next, further details of the hardware description of the computing environment according to exemplary embodiments is described with reference to FIG. 13. In FIG. 13, a controller 1300 is described embodying the computing device 142 of the charging station 100 of the present disclosure, in which the controller is a computing device which includes a CPU 1301 which performs the processes described above/below. The process data and instructions may be stored in memory 1302. These processes and instructions may also be stored on a storage medium disk 1304 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1301, 1303 and an operating system such as Microsoft Windows 7, Microsoft Windows 8, Microsoft Windows 10, UNIX, Solaris, LINUX, Apple MAC-OS and other systems known to those skilled in the art.

The hardware elements in order to achieve the computing device may be realized by various circuitry elements, known to those skilled in the art. For example, CPU 1301 or CPU 1303 may be a Xenon or Core processor from Intel of America or an Opteron processor from AMD of America, or may be other processor types that would be recognized by one of ordinary skill in the art. Alternatively, the CPU 1301, 1303 may be implemented on an FPGA, ASIC, PLD or using discrete logic circuits, as one of ordinary skill in the art would recognize. Further, CPU 1301, 1303 may be implemented as multiple processors cooperatively working in parallel to perform the instructions of the inventive processes described above.

The computing device in FIG. 13 also includes a network controller 1306, such as an Intel Ethernet PRO network interface card from Intel Corporation of America, for interfacing with network 1360. As can be appreciated, the network 1360 can be a public network, such as the Internet, or a private network such as an LAN or WAN network, or any combination thereof and can also include PSTN or ISDN sub-networks. The network 1360 can also be wired, such as an Ethernet network, or can be wireless such as a cellular network including EDGE, 3G, 4G and 5G wireless cellular systems. The wireless network can also be WiFi, Bluetooth, or any other wireless form of communication that is known.

The computing device further includes a display controller 1308, such as a NVIDIA GeForce GTX or Quadro graphics adaptor from NVIDIA Corporation of America for interfacing with display 1310, such as a Hewlett Packard HPL2445w LCD monitor. A general purpose I/O interface 1312 interfaces with a keyboard and/or mouse 1314 as well as a touch screen panel 1316 on or separate from display 1310. General purpose I/O interface also connects to a variety of peripherals 1318 including printers and scanners, such as an OfficeJet or DeskJet from Hewlett Packard.

A sound controller 1320 is also provided in the computing device such as Sound Blaster X-Fi Titanium from Creative, to interface with speakers/microphone 1322 thereby providing sounds and/or music.

The general purpose storage controller 1324 connects the storage medium disk 1304 with communication bus 1326, which may be an ISA, EISA, VESA, PCI, or similar, for interconnecting all of the components of the computing device. A description of the general features and functionality of the display 1310, keyboard and/or mouse 1314, as well as the display controller 1308, storage controller 1324, network controller 1306, sound controller 1320, and general purpose I/O interface 1312 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 14.

Figure 14:
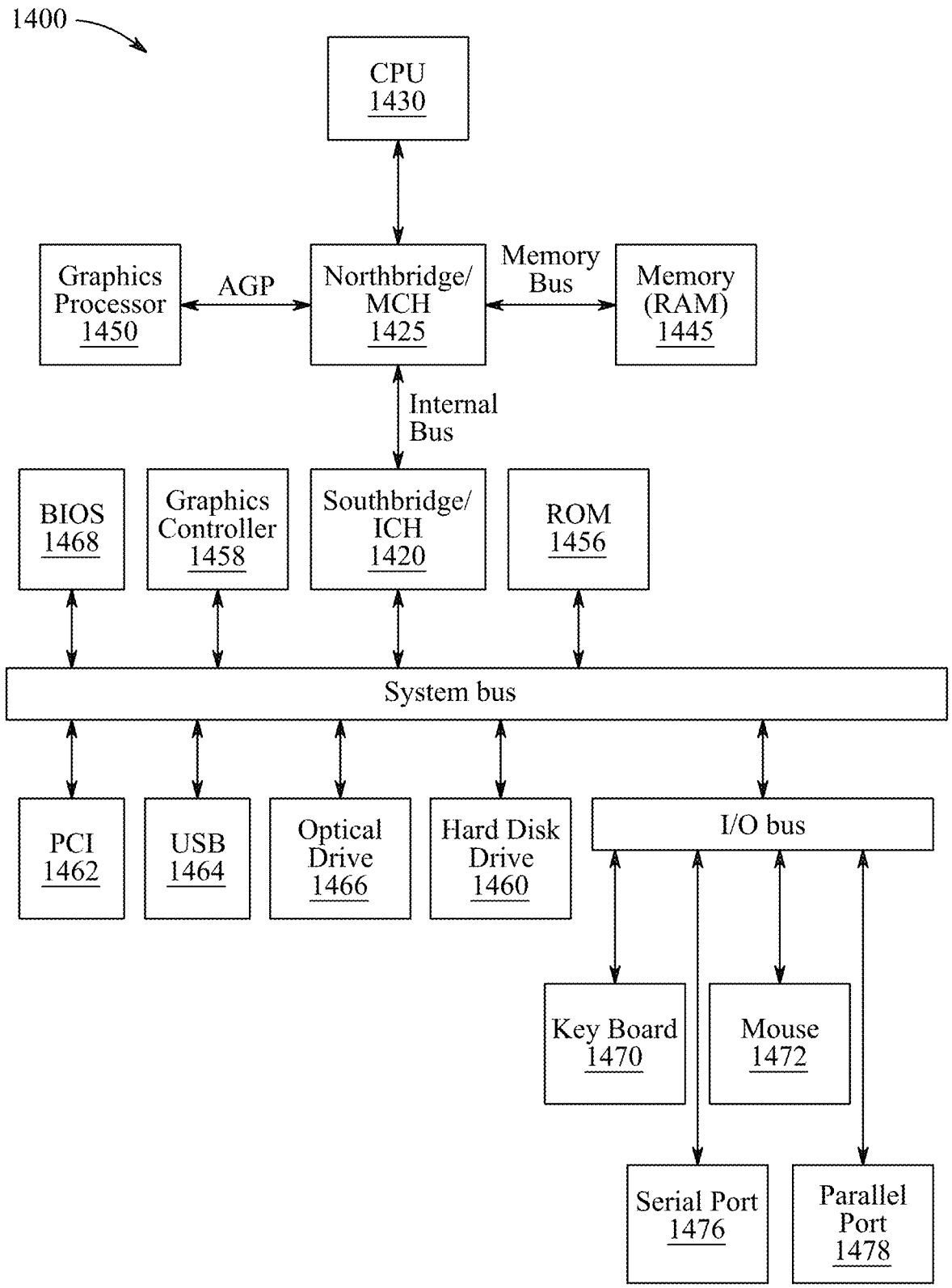
FIG. 14 is an exemplary schematic diagram of a data processing system used within the computing system, according to certain embodiments.

FIG. 14 shows a schematic diagram of a data processing system, according to certain embodiments, for performing the functions of the exemplary embodiments. The data processing system is an example of a computer in which code or instructions implementing the processes of the illustrative embodiments may be located.

In FIG. 14, data processing system 1400 employs a hub architecture including a north bridge and memory controller hub (NB/MCH) 1425 and a south bridge and input/output (I/O) controller hub (SB/ICH) 1420. The central processing unit (CPU) 1430 is connected to NB/MCH 1425. The NB/MCH 1425 also connects to the memory 1445 via a memory bus, and connects to the graphics processor 1450 via an accelerated graphics port (AGP). The NB/MCH 1425 also connects to the SB/ICH 1420 via an internal bus (e.g., a unified media interface or a direct media interface). The CPU Processing unit 1430 may contain one or more processors and even may be implemented using one or more heterogeneous processor systems.

Figure 15:
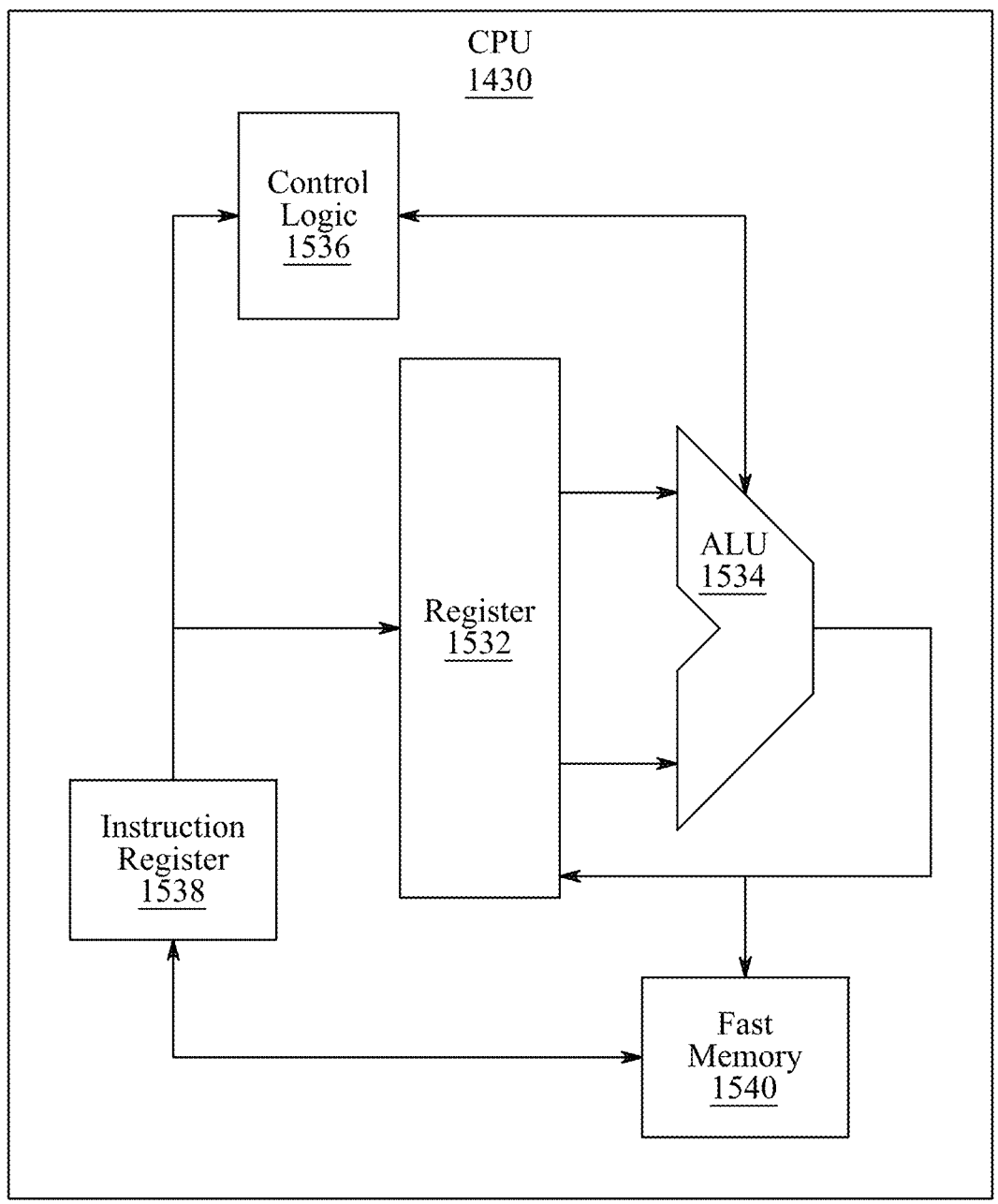
FIG. 15 is an exemplary schematic diagram of a processor used with the computing system, according to certain embodiments.

For example, FIG. 15 shows one implementation of CPU 1430. In one implementation, the instruction register 1538 retrieves instructions from the fast memory 1540. At least part of these instructions are fetched from the instruction register 1538 by the control logic 1536 and interpreted according to the instruction set architecture of the CPU 1430. Part of the instructions can also be directed to the register 1532. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1534 that loads values from the register 1532 and performs logical and mathematical operations on the loaded values according to the instructions. The results from these operations can be feedback into the register and/or stored in the fast memory 1540. According to certain implementations, the instruction set architecture of the CPU 1430 can use a reduced instruction set architecture, a complex instruction set architecture, a vector processor architecture, a very large instruction word architecture. Furthermore, the CPU 1430 can be based on the Von Neuman model or the Harvard model. The CPU 1430 can be a digital signal processor, an FPGA, an ASIC, a PLA, a PLD, or a CPLD. Further, the CPU 1430 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 14, the data processing system 1400 can include that the SB/ICH 1420 is coupled through a system bus to an I/O Bus, a read only memory (ROM) 1456, universal serial bus (USB) port 1464, a flash binary input/output system (BIOS) 1468, and a graphics controller 1458. PCI/PCIe devices can also be coupled to SB/ICH 1488 through a PCI bus 1462.

The PCI devices may include, for example, Ethernet adapters, add-in cards, and PC cards for notebook computers. The Hard disk drive 1460 and CD-ROM 1466 can use, for example, an integrated drive electronics (IDE) or serial advanced technology attachment (SATA) interface. In one implementation the I/O bus can include a super I/O (SIO) device.

Further, the hard disk drive (HDD) 1460 and optical drive 1466 can also be coupled to the SB/ICH 1420 through a system bus. In one implementation, a keyboard 1470, a mouse 1472, a parallel port 1478, and a serial port 1476 can be connected to the system bus through the I/O bus. Other peripherals and devices that can be connected to the SB/ICH 1420 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry or based on the requirements of the intended back-up load to be powered.

Figure 16:
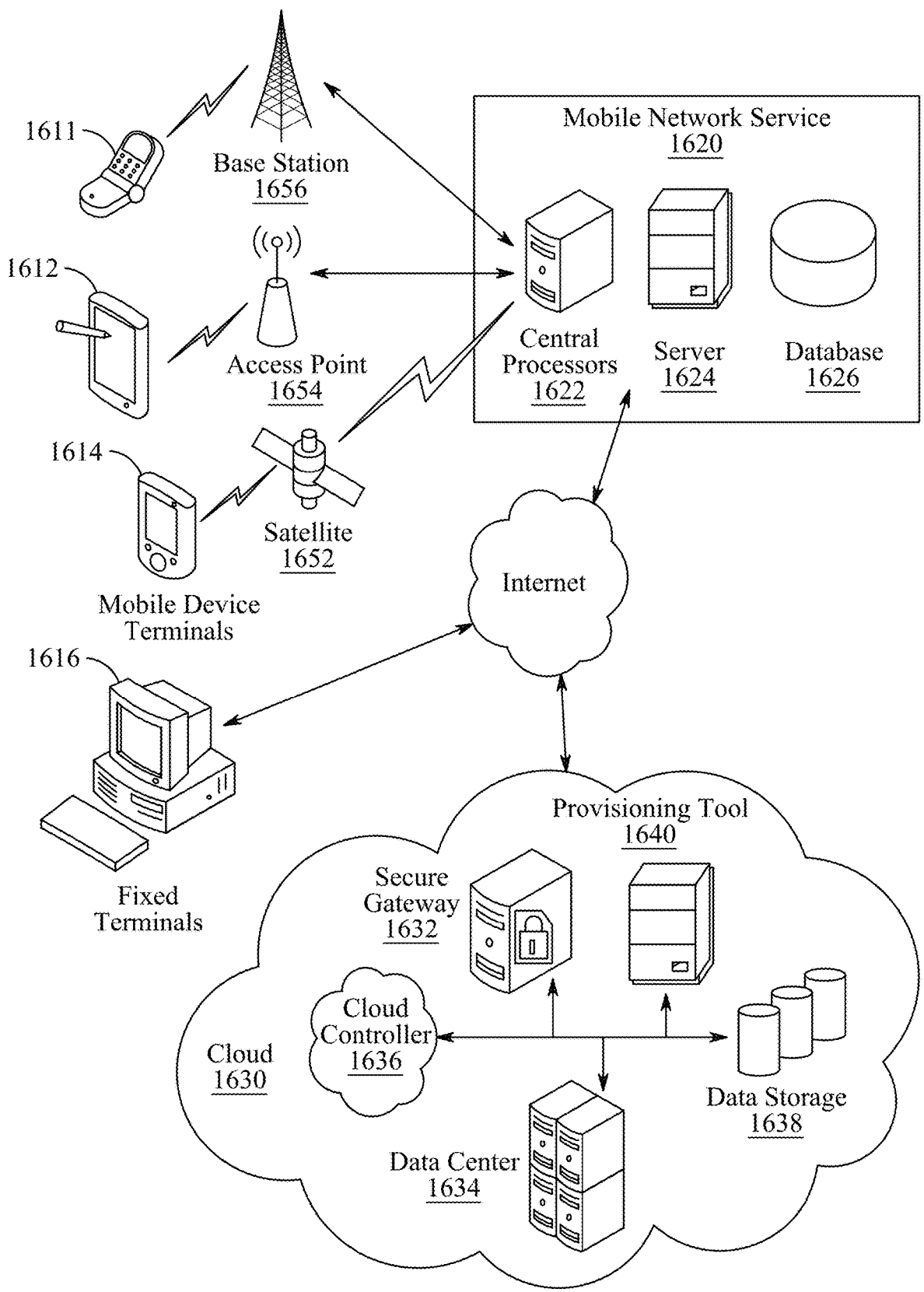
FIG. 16 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, such as cloud 1630 including a cloud controller 1636, a secure gateway 1632, a data center 1634, data storage 1638 and a provisioning tool 1640, and mobile network services 1620 including central processors 1622, a server 1624 and a database 1626, which may share processing, as shown by FIG. 16, in addition to various human interface and communication devices (e.g., display monitors 1616, smart phones 1610, tablets 1612, personal digital assistants (PDAs) 1614). The network may be a private network, such as a LAN, satellite 1652 or WAN 1654, or be a public network, may such as the Internet. Input to the system may be received via direct user input and received remotely in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A charging station for electric vehicles, comprising:
a plurality of charge terminals located above ground;
a plurality of charging pods located below ground, wherein each charging pod is connected to one of the plurality of charge terminals, wherein each charging pod includes:
an electric vehicle charger including a plurality of electronic charging components;
a plurality of heat exchange plates located in the electric vehicle charger over the electronic charging components, wherein each heat exchange plate includes a coolant inlet and a coolant outlet, wherein the coolant inlet and the coolant outlet are connected to an inlet end and an outlet end respectively of a serpentine coolant coil located on the heat exchange plate;
a coolant input line connected to the coolant inlet of each heat exchange plate;
a coolant output line connected to the coolant outlet of each heat exchange plate;
a cooling system including:
a coolant supply tank, wherein the coolant supply tank is configured to hold a coolant, and
a coolant pump;
a plurality of geothermal coils fluidly connected between the coolant output line and the coolant pump, wherein the plurality of geothermal coils are buried at a below ground depth in a range of about 15 m to about 20 m;
a reversible motor connected to the coolant pump;
a variable flow device connected to a coolant pump input pipe;
an ultrasonic flow meter connected to a coolant pump output pipe, wherein the ultrasonic flow meter is configured to generate pressure measurement signals of a coolant flow in the coolant pump output pipe;
a power supply connected through a relay to the reversible motor;
a plurality of temperature sensors, wherein each temperature sensor is configured to perform temperature measurements and generate temperature measurement signals; and
a computing device located within each charging pod, wherein the computing device is operatively connected to the reversible motor, the variable flow device, the ultrasonic flow meter and the power supply, wherein the computing device includes an electrical circuitry, a memory configured to store program instructions and at least one processor configured to execute the program instructions, wherein the computing device is configured to:
receive power from the power supply,
receive the temperature measurement signals from the plurality of temperature sensors,
receive pressure measurement signals from the ultrasonic flow meter,
receive flow measurement signals from the variable flow device,
compare the temperature measurement signals to a temperature threshold, and
actuate the reversible motor to pump coolant to the coolant inlet to lower the temperature of the heat exchange plates when the temperature measurement signals exceed the temperature threshold.

2. The charging station of claim 1, wherein the plurality of temperature sensors comprise:
a heat exchange plate temperature sensor located within each charging pod;
a coolant outlet temperature sensor located at each coolant outlet; and
a coolant tank temperature sensor located in each coolant supply tank.

3. The charging station of claim 1, further comprising:
an underground enclosure configured to surround the electric vehicle charger, the coolant supply tank, the coolant pump, the reversible motor, the variable flow device and the ultrasonic flow meter, wherein the underground enclosure is located at a depth of about one meter to three meters below ground, wherein the underground enclosure is constructed from reinforced concrete.

4. The charging station of claim 1, wherein the computing device is configured to:
subtract an amplitude of the pressure measurement signals from a pressure setpoint;
generate an error correction signal; and
transmit the error correction signal to the variable flow device, wherein the variable flow device is configured to adjust a pressure of a flow of coolant to the coolant pump when a magnitude of the error correction signal is not equal to the pressure setpoint.

5. The charging station of claim 1, further comprising:
a first end of the geothermal coils connected to the coolant output line and a second end of the geothermal coils connected to the coolant pump.

6. A charging station for electric vehicles, comprising:
a plurality of charge terminals located above ground;
a plurality of charging pods located below ground, wherein each charging pod is connected to one of the plurality of charge terminals, wherein each charging pod includes:
an electric vehicle charger including a plurality of electronic charging components;
a plurality of heat exchange plates located in the electric vehicle charger over the electronic charging components, wherein each heat exchange plate includes a coolant inlet and a coolant outlet, wherein the coolant inlet and the coolant outlet are connected to an inlet end and an outlet end respectively of a serpentine coolant coil located on the heat exchange plate;

a coolant input line connected to the coolant inlet of each heat exchange plate;

a coolant output line connected to the coolant outlet of each heat exchange plate;

a cooling system including:
 a coolant supply tank, wherein the coolant supply tank is configured to hold a coolant, and
 a coolant pump;
 a plurality of geothermal coils fluidly connected between the coolant output line and the coolant pump, wherein the plurality of geothermal coils are buried at a below ground depth in a range of about 15 m to about 20 m:

a reversible motor connected to the coolant pump;

a variable flow device connected to a coolant pump input pipe;

an ultrasonic flow meter connected to a coolant pump output pipe, wherein the ultrasonic flow meter is configured to generate pressure measurement signals of a coolant flow in the coolant pump output pipe;

a power supply connected through a relay to the reversible motor;

a plurality of temperature sensors, wherein each temperature sensor is configured to perform temperature measurements and generate temperature measurement signals; and a computing device located within each charging pod, wherein the computing device is operatively connected to the reversible motor, the variable flow device, the ultrasonic flow meter and the power supply, wherein the computing device includes an electrical circuitry, a memory configured to store program instructions and at least one processor configured to execute the program instructions, wherein the computing device is configured to:
 receive power from the power supply,
 receive the temperature measurement signals from the plurality of temperature sensors,
 receive pressure measurement signals from the ultrasonic flow meter,
 receive flow measurement signals from the variable flow device,
 compare the temperature measurement signals to a temperature threshold, and
 actuate the reversible motor to pump coolant to the plurality of geothermal coils to raise the temperature of the heat exchange plates when the temperature measurement signals are less than the temperature threshold.

7. The charging station of claim 1, further comprising:
a charging cable having a first end connected to the electronic charging components of the electric vehicle charger, wherein a second end of the charging cable is connected to the charge terminal; and
a charge plug located on the charge terminal, wherein the charge plug is configured to connect to a charge socket of an electric vehicle.

8. The charging station of claim 7, wherein each charge plug is configured to deliver a DC fast charge to the charge socket of the electric vehicle.

9. The charging station of claim 1, wherein the plurality of charging pods are located below ground at a depth in a range of about one meter to about three meters.

10. The charging station of claim 1, wherein the coolant is water.

11. The charging station of claim 1, wherein the coolant is a non-toxic, environmentally friendly coolant selected from the group consisting of water, ammonia and propylene glycol.

12. The charging station of claim 1, wherein the serpentine cooling coil, the coolant input line, the coolant output line and the geothermal coils are made from high-density polyethylene (HDPE).

13. The charging station of claim 12, wherein the coolant input line, the coolant output line and the geothermal coils are double walled pipes.

14. The charging station of claim 1, wherein each charging pod includes the electric vehicle charger and the cooling system in a single unit, wherein the single unit is surrounded by a reinforced concrete enclosure.

15. The charging station of claim 14, further comprising:
a plurality of access shafts, wherein each access shaft is configured to connect between the surface of the ground and a respective single unit, wherein each access shaft is encased in reinforced concrete.

16. The charging station of claim 1, further comprising:
a plurality of access shafts, wherein each access shaft is configured to connect between the surface of the ground and a respective charging pod, wherein each access shaft is encased in reinforced concrete.

17. The charging station of claim 1, wherein each heat exchange plate comprises:
a plurality of cooling plates, wherein:
 each cooling plate is made of a material which has a high thermal conductivity,
 the material is one of copper, aluminum nitride, aluminum, zinc coated steel and zinc coated iron,
 each cooling plate includes the serpentine coolant coil,
 the serpentine coolant coil is made of high-density polyethylene,
 the serpentine coolant coil has at least four parallel loops and less than twenty parallel loops, and
 the plurality of cooling plates are configured to cover the plurality of electronic components of each charging pod, wherein each cooling plate is about 400 mm in height and about 600 mm in width.

18. A method for regulating a temperature of each of a charging pod of a charging station for electric vehicles, comprising:
installing a plurality of charge terminals above ground;
installing a plurality of charging pods below ground, wherein each charging pod is connected to a respective one of the plurality of charge terminals, each charging pod including an electric vehicle charger having a plurality of electronic charging components;
installing a plurality of heat exchange plates over the electronic charging components, wherein each heat exchange plate includes a coolant inlet and a coolant outlet;
connecting the coolant inlet and the coolant outlet to an inlet end and an outlet end respectively of a serpentine coolant coil located on the heat exchange plate;
connecting a coolant input line to the coolant inlet of each heat exchange plate;
connecting a coolant output line to the coolant outlet of each heat exchange plate;
installing a cooling system including:

a coolant supply tank, wherein the coolant supply tank is configured to hold a coolant, and
a coolant pump;
installing a plurality of geothermal coils at a below ground depth in a range of about 15 m to about 20 m;
fluidly connecting the coolant output line to a first coil of the geothermal coils and the coolant pump to a second end of the geothermal coils,
connecting a reversible motor to the coolant pump;
connecting a variable flow device to a coolant pump input pipe;
connecting an ultrasonic flow meter to a coolant pump output pipe;
connecting a coolant tank inlet to the coolant pump output pipe;
generating, by the ultrasonic flow meter, pressure measurement signals of a coolant flow in the coolant pump output pipe;
connecting a power supply through a relay to the reversible motor;
installing a temperature sensor of the plurality of temperature sensors in each charging pod, on each coolant output line and on each charge terminal;
performing, by each temperature sensor, temperature measurements;
generating, by each temperature sensor, temperature measurement signals;
installing a computing device in each charging pod; and
operatively connecting each computing device to the reversible motor, the variable flow device, the ultrasonic flow meter and the power supply of each charging pod, wherein the computing device includes an electrical circuitry, a memory configured to store program instructions and at least one processor configured for executing the program instructions for:
receiving power from the power supply,
receiving the temperature measurement signals from the plurality of temperature sensors,
receiving pressure measurement signals from the ultrasonic flow meter,
receiving flow measurement signals from the variable flow device,
comparing the temperature measurement signals to a temperature threshold,
actuating the reversible motor to pump coolant to the coolant inlet to lower the temperature of the heat exchange plates when the temperature measurement signals exceed the temperature threshold, and
actuating the reversible motor to draw coolant from the coolant inlet to raise the temperature of the heat exchange plates when the temperature measurement signals are less than the temperature threshold.

\* \* \* \* \*